(12) United States Patent
Shin et al.

(10) Patent No.: US 12,349,549 B2
(45) Date of Patent: Jul. 1, 2025

(54) DISPLAY DEVICE INCLUDING MULTIPLE ANTI-CONTACT LAYERS AND METHOD OF FABRICATING THE SAME

(71) Applicant: Samsung Display Co., LTD., Yongin-si (KR)

(72) Inventors: Hyun Eok Shin, Gwacheon-si (KR); Gyung Min Baek, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 590 days.

(21) Appl. No.: 17/701,639

(22) Filed: Mar. 22, 2022

(65) Prior Publication Data

US 2022/0392977 A1 Dec. 8, 2022

(30) Foreign Application Priority Data

May 28, 2021 (KR) .................. 10-2021-0068926

(51) Int. Cl.
*H10K 59/122* (2023.01)
*H10K 50/816* (2023.01)
*H10K 71/00* (2023.01)
*H10K 59/12* (2023.01)
*H10K 102/00* (2023.01)

(52) U.S. Cl.
CPC ......... *H10K 59/122* (2023.02); *H10K 50/816* (2023.02); *H10K 71/00* (2023.02); *H10K 59/1201* (2023.02); *H10K 2102/351* (2023.02)

(58) Field of Classification Search
CPC .... H10K 59/122; H10K 50/816; H10K 71/00; H10K 2102/351

USPC .......................................................... 257/91
See application file for complete search history.

(56) References Cited

U.S. PATENT DOCUMENTS

| 8,723,166 | B2 | 5/2014 | Park |
| 9,343,698 | B2 | 5/2016 | Negishi |
| 10,705,384 | B2 | 7/2020 | Kwak et al. |
| 10,950,680 | B2 | 3/2021 | Lim et al. |
| 2003/0146695 | A1* | 8/2003 | Seki ..................... H10K 50/865 313/506 |

(Continued)

FOREIGN PATENT DOCUMENTS

| CN | 107068722 | | 8/2017 |
| CN | 212809165 U | * | 3/2021 |

(Continued)

*Primary Examiner* — Nduka E Ojeh
*Assistant Examiner* — Laura M Dykes
(74) *Attorney, Agent, or Firm* — KILE PARK REED & HOUTTEMAN PLLC

(57) ABSTRACT

A display device includes a substrate; an anode electrode disposed on the substrate; a first anti-contact layer disposed on the anode electrode and including molybdenum trioxide ($MoO_3$); a second anti-contact layer disposed on the first anti-contact layer and including molybdenum dioxide ($MoO_2$); and a pixel-defining layer disposed on the second anti-contact layer, wherein the first anti-contact layer includes a first opening, wherein the second anti-contact layer includes a second opening, wherein the pixel-defining layer includes a third opening, and wherein the first opening, the second opening and the third opening overlap one another and expose the anode electrode.

21 Claims, 18 Drawing Sheets

(56) References Cited

U.S. PATENT DOCUMENTS

| | | | | |
|---|---|---|---|---|
| 2008/0230772 | A1* | 9/2008 | Kamiura | H10K 71/13 |
| | | | | 257/40 |
| 2018/0375057 | A1 | 12/2018 | Shin et al. | |
| 2019/0280063 | A1* | 9/2019 | Lee | H10K 71/221 |
| 2019/0288043 | A1* | 9/2019 | Shin | H10K 50/813 |
| 2020/0312930 | A1* | 10/2020 | Choi | H10K 59/122 |
| 2022/0093721 | A1* | 3/2022 | Kim | H10D 86/60 |
| 2022/0285466 | A1* | 9/2022 | Meng | H10K 59/122 |
| 2022/0399411 | A1* | 12/2022 | Li | H10K 71/00 |

FOREIGN PATENT DOCUMENTS

| | | | | |
|---|---|---|---|---|
| KR | 10-2004-0037663 | | 5/2004 | |
| KR | 10-2014-0118787 | | 10/2014 | |
| KR | 10-2019-0001629 | | 1/2019 | |
| KR | 10705384 | | 7/2019 | |
| KR | 10-2020-0001415 | | 1/2020 | |
| WO | WO-2013047621 A1 * | | 4/2013 | H01L 27/3246 |

* cited by examiner

DISPLAY DEVICE INCLUDING MULTIPLE ANTI-CONTACT LAYERS AND METHOD OF FABRICATING THE SAME

CROSS REFERENCE TO RELATED APPLICATION

This application claims priority from and the benefit of Korean Patent Application No. 10-2021-0068926, filed on May 28, 2021, which is hereby incorporated by reference for all purposes as if fully set forth herein.

BACKGROUND

Field

Embodiments of the invention relate generally to a display device, and a method of fabricating the same.

Discussion of the Background

As the information-oriented society evolves, various demands for display devices are ever increasing. For example, display devices are being employed by a variety of electronic devices such as smart phones, digital cameras, laptop computers, navigation devices, and smart televisions.

A variety of types of display devices are currently used, such as liquid-crystal display (LCD) devices and organic light-emitting display (OLED) devices. Among them, the organic light-emitting display device displays images by using an organic light-emitting device that emits light as electrons and holes recombine.

An organic light-emitting element includes two electrodes, and a shared layer and an emissive layer disposed between the two electrodes. Electrons injected from one electrode and holes injected from the other electrode are combined in the emissive layer to form excitons. Light is emitted as an energy is released when the excitons relax from an excited state to the ground state. An organic light-emitting display device is a self-luminous device and thus requires no additional light source such as a backlight. Accordingly, it consumes less power, and has a short response time, a wide viewing angle, and a good contrast ratio.

The above information disclosed in this Background section is only for understanding of the background of the inventive concepts, and, therefore, it may contain information that does not constitute prior art.

SUMMARY

Embodiments constructed in accordance with the inventive concepts are capable of providing a display device that can suppress or prevent defects such as voids and dark spots of an anode electrode and that can suppress or prevent lateral leakage current between adjacent pixels.

According to an embodiment, a display device can solve the issues of reflectance, color gamut and bands of reflected colors, while suppressing or preventing defects such as voids and dark spots of an anode electrode, as well as lateral leakage current between adjacent pixels.

Additional features of the inventive concepts will be set forth in the description that follows, and in part will be apparent from the description, or may be learned by practice of the inventive concepts.

According to an embodiment, a display device includes a substrate; an anode electrode disposed on the substrate; a first anti-contact layer disposed on the anode electrode and including molybdenum trioxide ($MoO_3$); a second anti-contact layer disposed on the first anti-contact layer and including molybdenum dioxide ($MoO_2$); and a pixel-defining layer disposed on the second anti-contact layer, wherein the first anti-contact layer defines a first opening penetrating it in a thickness direction, wherein the second anti-contact layer defines a second opening penetrating it in the thickness direction, wherein the pixel-defining layer defines a third opening penetrating it in the thickness direction, and wherein the first opening, the second opening and the third opening overlap one another and expose the anode electrode.

A display device may further include a hole injection/transport layer having a first hole injection/transport layer disposed on the anode electrode exposed by the first opening, the second opening and the third opening, and a second hole injection/transport layer disposed on the pixel-defining layer, wherein the first hole injection/transport layer and the second hole injection/transport layer are separated from each other.

The first hole injection/transport layer may have an island shape in a plan view.

A display device may further include a plurality of emission areas; and a non-emission area surrounding each of the plurality of emission areas, wherein the first hole injection/transport layer is disposed in each of the emission areas.

The pixel-defining layer may include: an overlapping portion overlapping at least one of the first anti-contact layer and the second anti-contact layer; and a non-overlapping portion overlapping with neither the first anti-contact layer nor the second anti-contact layer but with the anode electrode.

A display device may further include an emissive layer disposed on the first hole injection/transport layer, wherein the emissive layer is disposed between the non-overlapping portion of the pixel-defining layer and the anode electrode.

A display device may further include an electron injection/transport layer disposed on the emissive layer; and a cathode electrode disposed on the electron injection/transport layer.

A light transmittance of the first anti-contact layer may be greater than a light transmittance of the second anti-contact layer.

A thickness of the second anti-contact layer may lie within a range of 1,000 Å to 9,000 Å.

An electrical resistance of the first anti-contact layer may be greater than an electrical resistance of the second anti-contact layer.

An entire area of the second anti-contact layer may overlap the first anti-contact layer.

An inner wall of the third opening may protrude outward from an inner wall of the first opening.

The inner wall of the first opening may protrude outward from an inner wall of the second opening.

The first opening may surround the third opening when viewed from the top, and the second opening surrounds the first opening.

The anode electrode may include a first stacked conductive layer, a second stacked conductive layer and a third stacked conductive layer sequentially stacked on one another, wherein the first stacked conductive layer and the third stacked conductive layer include indium-tin-oxide (ITO), and wherein the second stacked conductive layer includes silver (Ag).

According to an embodiment, a display device includes a substrate; an anode electrode disposed on the substrate; a first anti-contact layer including molybdenum trioxide ($MoO_3$) and disposed on the anode electrode to expose the anode electrode; and a pixel-defining layer disposed on the first anti-contact layer and exposing the anode electrode exposed by the first anti-contact layer, wherein the first anti-contact layer defines a first opening penetrating it in a thickness direction, wherein the pixel-defining layer defines a second opening penetrating it in the thickness direction and overlapping the first opening, and wherein an inner wall of the second opening is disposed more to an outside than an inner wall of the first opening.

A display device may further include a second anti-contact layer disposed between the first anti-contact layer and the pixel-defining layer and including molybdenum dioxide ($MoO_2$).

A light transmittance of the first anti-contact layer may be greater than a light transmittance of the second anti-contact layer, and wherein an electrical resistance of the first anti-contact layer is greater than an electrical resistance of the second anti-contact layer.

A display device may further include a hole injection/transport layer having a first hole injection/transport layer disposed on the anode electrode exposed by the first anti-contact layer and the pixel-defining layer, and a second hole injection/transport layer disposed on the pixel-defining layer, wherein the first hole injection/transport layer and the second hole injection/transport layer are separated from each other.

The pixel-defining layer may include an overlapping portion overlapping the first anti-contact layer, and a non-overlapping portion overlapping not with the first anti-contact layer but with the anode electrode.

A display device may further include an emissive layer disposed on the first hole injection/transport layer, wherein the emissive layer is disposed between the non-overlapping portion of the pixel-defining layer and the anode electrode.

The first hole injection/transport layer may have an island shape in a plan view.

According to an embodiment, a method of fabricating a display device including a substrate, an anode electrode disposed on the substrate, a material layer for a first anti-contact layer disposed on the anode electrode, a second anti-contact layer disposed on the material layer for the first anti-contact layer to expose the material layer for the first anti-contact layer, and a material layer for a pixel-defining layer disposed on the second anti-contact layer and the material layer for the first anti-contact layer exposed by the second anti-contact layer, the method including: exposing the material layer for the pixel-defining layer to light and developing it to form a pixel-defining layer exposing the material layer for the first anti-contact layer exposed by the second anti-contact layer; and etching the material layer for the first anti-contact layer exposed by the pixel-defining layer and the second anti-contact layer to form a first anti-contact layer exposing the anode electrode, wherein the material layer for the first anti-contact layer includes molybdenum trioxide ($MoO_3$), and wherein the second anti-contact layer includes molybdenum dioxide ($MoO_2$).

The material layer for the first anti-contact layer may be etched by a developer for developing the material layer for the pixel-defining layer.

A method of fabricating a display device may further include cleaning the pixel-defining layer after forming the pixel-defining layer, wherein the material layer for the first anti-contact layer is etched by a cleaning solution.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
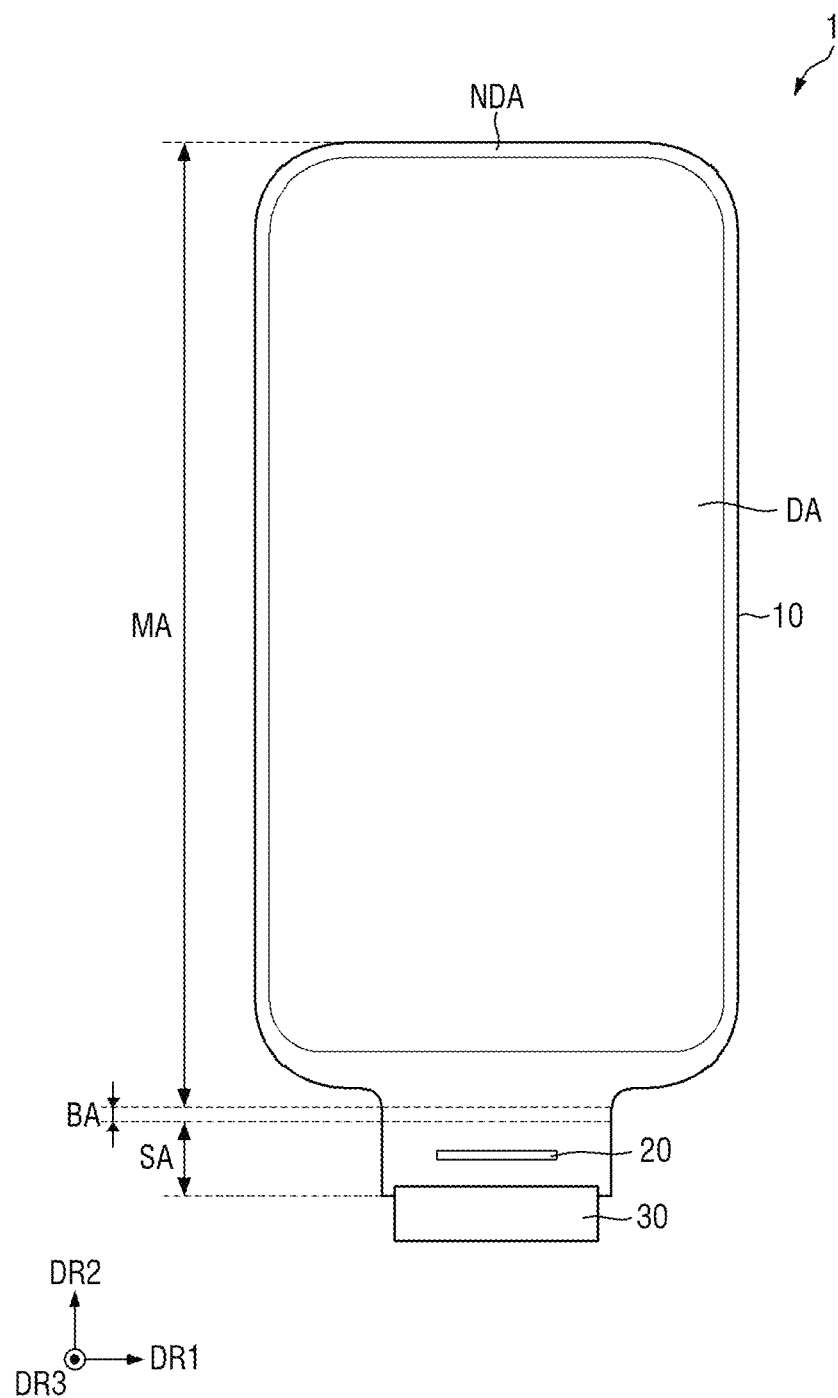
FIG. 1 is a plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to the accompanying drawings.

Figure 2:
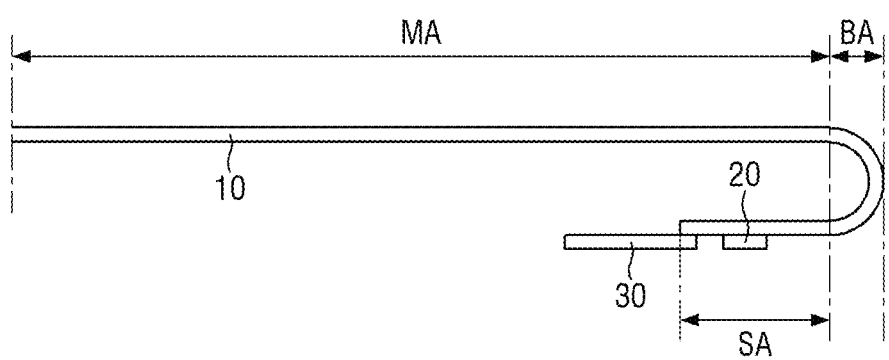
FIG. 2 is a side view of the display device of FIG. 1 when it is bent in a thickness direction.
Figure 2:
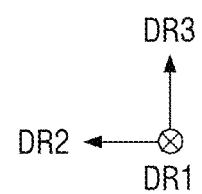

FIG. 1 is a plan view of a display device according to an embodiment. FIG. 2 is a side view of the display device of FIG. 1. FIG. 2 shows a side shape of a display device when it is bent in thickness direction.

In the drawings, the first direction DR1 denotes the horizontal direction of a display device 1 and the second direction DR2 denotes the vertical direction of the display device 1 when viewed from the top. In addition, the third direction DR3 may refer to the thickness direction of the display device 1. The first direction DR1 is perpendicular to the second direction DR2. The third direction the third direction DR3 is orthogonal to the plane in which the first direction DR1 and the second direction DR2 lie and is perpendicular to the first and second directions DR1 as well as the second direction DR2. It should be understood that the directions referred to in the embodiments are relative directions, and the embodiments are not limited to the directions mentioned.

In the following description, the first direction DR1 indicates the right direction, the opposite direction of the first direction DR1 indicates the left direction, the second direction DR2 indicates the upper direction, and the opposite direction of the second direction DR2 indicates the lower direction, unless specifically stated otherwise. In addition, the terms "top", "upper surface" and "upper side" in the third direction DR3 refer to the display side of a display panel 10, whereas the terms "bottom", "lower surface" and "lower" refer to the opposite side of the display panel 10, unless stated otherwise.

Referring to FIGS. 1 and 2, the display device 1 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

According to an embodiment, the display device 1 may have a substantially rectangular shape when viewed from the top. The display device 1 may have a rectangular shape with corners at the right angle when viewed from the top. It is, however, to be understood that the embodiment described herein is not limited thereto. The display device 1 may have a rectangular shape with rounded corners when viewed from the top.

When the display device 1 has a rectangular shape when viewed from the top, the length of two sides which are disposed on one side and the other side in the first direction DR1, respectively, and are extended in the second direction DR2 may be larger than the length of two sides which are disposed on one side and the other side in the second direction DR2, respectively, and are extended in the first direction DR1. In other words, the two sides of the display device 1 disposed on one side and the other side in the first direction DR1, respectively, may be longer sides, and the two sides of the display device 1 disposed on one side and the other side in the second direction DR2, respectively, may be shorter sides.

The display device 1 may include a display panel 10. The display panel 10 may be a flexible substrate including a flexible polymer material such as polyimide. Accordingly, the display panel 10 may be curved, bent, folded, or rolled.

The display panel 10 may be an organic light-emitting display panel In the following description, the organic light-emitting display panel is employed as the display panel 10. It is, however, to be understood that other types of display panels such as a liquid-crystal display panel, a quantum-dot organic light-emitting display panel, a quantum-dot liquid-crystal display panel, a quantum-nano light-emitting display panel and a micro LED panel.

The display panel 10 may include a display area DA where images are displayed, and a non-display area NDA where no image is displayed. The display panel 10 may include the display area DA and the non-display area NDA when viewed from the top. The non-display area NDA may surround the display area DA. The non-display area NDA may form a bezel.

The display area DA may conform to the shape of display device 1 when viewed from the top. The display area DA may have a rectangular shape having corners at the right angle or rounded corners when viewed from the top. It is, however, to be understood that the embodiment described herein is not limited thereto. The shape of the display area DA is not limited to a rectangle, and it may have other shapes such as a circle and an ellipse.

The display area DA may include a plurality of pixels. The pixels may be arranged in a matrix. Each of the pixels may include an emissive layer and a circuit layer for controlling the amount of light emitted from the emissive layer. The circuit layer may include lines, electrodes and at least one transistor. The emissive layer may include an organic light-emitting material. The emissive layer may be sealed by an encapsulation layer. The configuration of the pixels will be described in detail later.

The non-display area NDA may surround all of the sides of the display area DA and may form the edges of the display area DA. It is, however, to be understood that the embodiment described herein is not limited thereto.

The display panel 10 may include a main area MA and a bending area BA connected to one side of the main area MA in the second direction DR2. The display panel 10 may further include a subsidiary area SA connected to one side of the bending area BA in the second direction DR2 and overlapping the main area MA when it is bent in the thickness direction.

The display area DA may be located in the main area MA. The non-display area NDA may be located at the peripheral edge of the display area DA in the main area MA.

The main area MA may have a shape similar to the outer shape of the display device 1 when viewed from the top. The main area MA may be a flat area located in one plane. It is, however, to be understood that the embodiment described herein is not limited thereto. At least one of the edges of the main area MA except for the edge (side) connected to the bending area BA may be bent to form a curved surface or may be bent at a right angle.

When at least one of the edges of the main area MA except for the edge (side) connected to the bending area BA is curved or bent, the display area DA may also be disposed at the edge. It is, however, to be understood that the embodiment described herein is not limited thereto. The non-display area NDA that does not display image may be disposed on the curved or bent edge, or the display area DA and the non-display area NDA may be disposed together.

The non-display area NDA of the main area MA may be extended from the outer border of the display area DA to the edge of the display panel 10. In the non-display area NDA of the main area MA, signal lines for applying signals to the display area DA or driving circuits may be disposed.

The bending area BA may be connected through one shorter side of the main area MA. The width of the bending area BA (the width in the first direction DR1) may be smaller than the width of the main area MA (the width of the shorter side). The portions where the main area MR meets the bending area BR may be cut in an L-shape when viewed from the top in order to reduce the bezel width.

In the bending area BA, the display panel 10 may be bent with a curvature toward the opposite side of the display surface. As the display panel 10 is bent at the bending area BA, the surface of the display panel 10 may be reversed. Specifically, the surface of the display panel 10 facing upward may be bent such that it faces outward at the bending area BA and then faces downward.

The subsidiary area SA is extended from the bending area BA. The subsidiary area SA may be extended in a direction parallel to the main area MA from the end of the bending region. The subsidiary area SA may overlap with the main area MA in the thickness direction of the display panel 10. The subsidiary area SA may overlap with the non-display area NDA at the edge of the main area MA and may also overlap with the display area DA of the main area MA. The width of the subsidiary area SA may be, but is not limited to being, equal to the width of the bending area BA.

Pads may be disposed on the subsidiary area SA of the display panel 10. An external device may be mounted (or attached) on the pads. Examples of the external device include a driving chip 20, a driving board 30 made of a flexible printed circuit board or a rigid printed circuit board, and other wire connection films, connectors, etc., which may also be mounted on the pad region. More than one external devices may be mounted on the subsidiary area SA. For example, as shown in FIGS. 1 and 2, the driving chip 20 may be disposed in the subsidiary area SA of the display panel 10, and the driving board 30 may be attached to an end of the subsidiary area SA. In such case, the display panel 10 may include a pad region connected to the driving chip 20, and a pad region connected to the driving board 30. According to another embodiment, a driving chip may be mounted on a film, and the film may be attached to the subsidiary area SA of the display panel 10.

The driving chip 20 is mounted on the surface of the display panel 10 which is the display surface. As the bending area BA is bent and reversed as described above, the driving chip 20 is mounted on the surface of the display panel 10 facing downward in the thickness direction, such that the upper surface of the driving chip 20 may face downward.

The driving chip 20 may be attached on the display panel 10 by an anisotropic conductive film or on the display panel 10 by ultrasonic bonding. The driving chip 20 may include an integrated circuit for driving the display panel 10.

Figure 3:
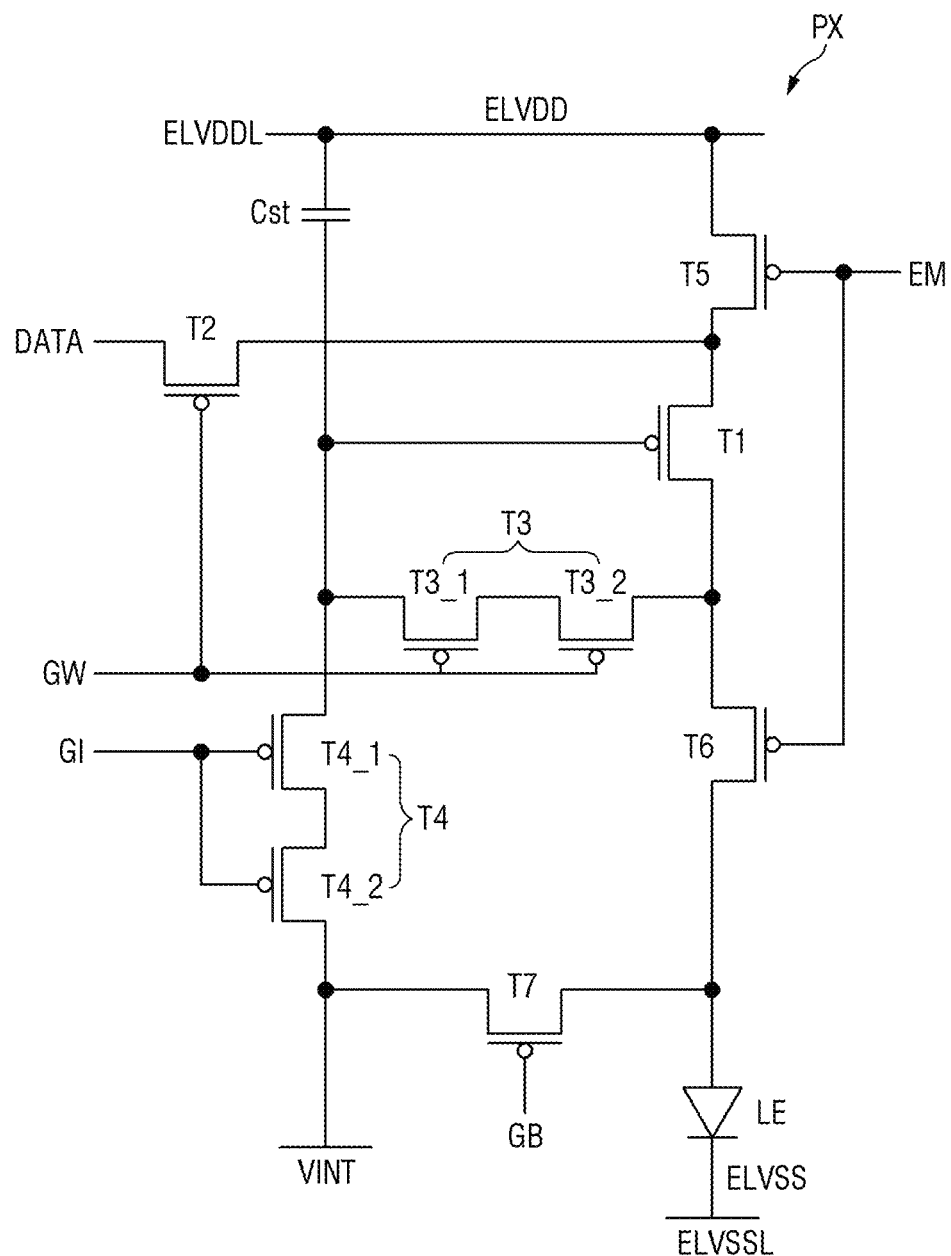
FIG. 3 is a circuit diagram showing a pixel according to an embodiment in detail.

FIG. 3 is a circuit diagram showing a pixel according to an embodiment in detail.

Referring to FIG. 3, the circuit of the pixel PX includes a plurality of transistors T1 to T7, a capacitor Cst, a light-emitting element LE, etc. To the circuit of a pixel PX, a data signal DATA, a first scan signal GW, a second scan signal GI, a third scan signal GB, an emission control signal EM, a first supply voltage ELVDD, a second supply voltage ELVSS, and an initialization voltage VINT are applied.

Figure 5:
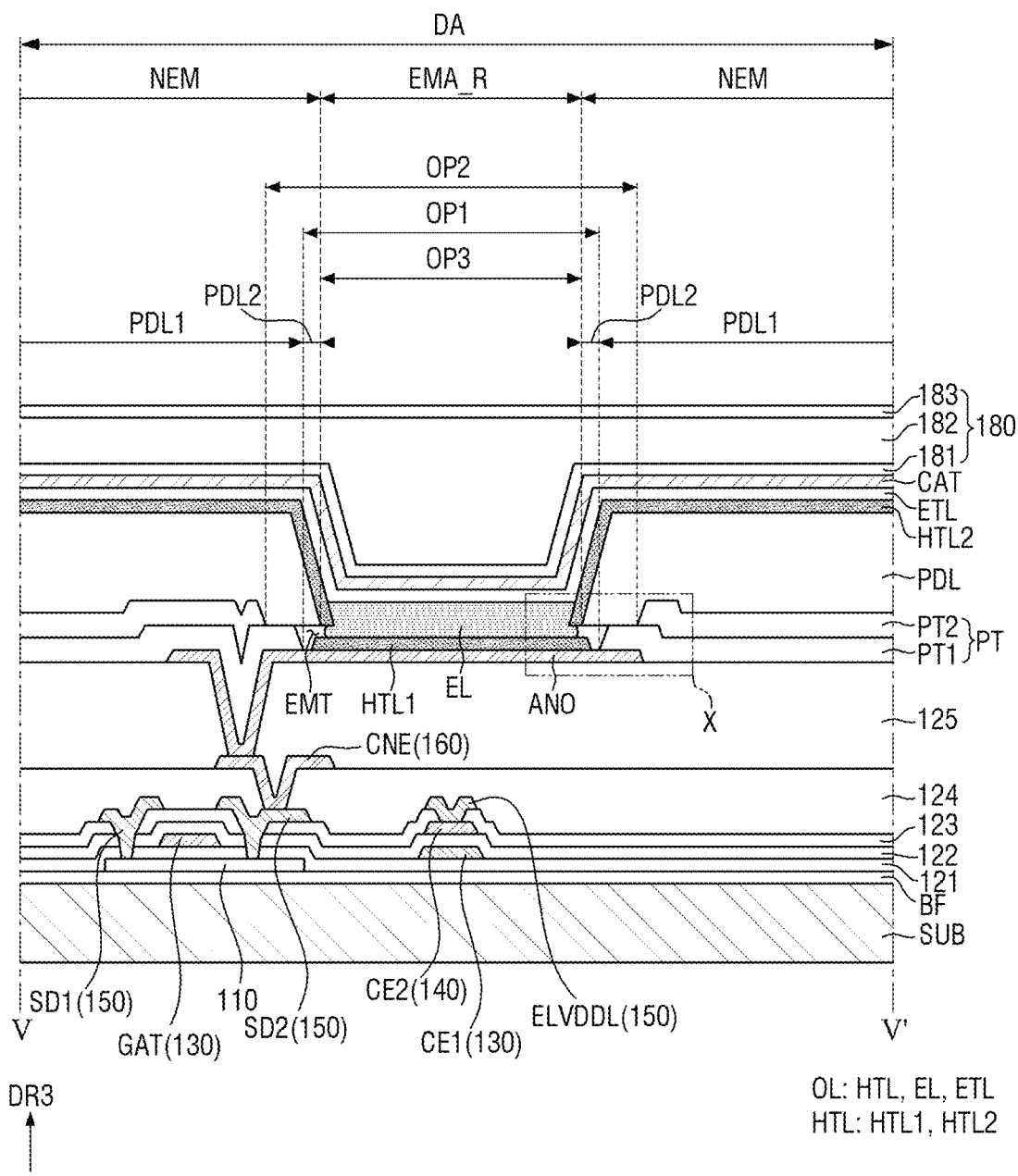
FIG. 5 is a cross-sectional view of a display panel of a pixel according to an embodiment.

The light-emitting element LE may be, but is not limited to, an organic light-emitting diode that includes a first electrode or an anode electrode ANO (see FIG. 5), an emissive layer EL (see FIG. 5), a second electrode or a cathode electrode CAT (see FIG. 5).

The plurality of transistors may include first to seventh transistors T1 to T7. Each of the transistors T1 to T7 includes a gate electrode, a first electrode (or a first source/drain electrode), and a second electrode (or a second source/drain electrode). One of the first electrode and the second electrode of each of the transistors T1 to T7 is a source electrode and the other is a drain electrode.

The first transistor T1 may operate as a driving transistor, and the second to seventh transistors T2 to T7 may operate as switching transistors. Each of the transistors T1 to T7 includes a gate electrode, a first electrode, and a second electrode. One of the first electrode and the second electrode of each of the transistors T1 to T7 is a source electrode and the other is a drain electrode.

Each of the transistors T1 to T7 may be a thin-film transistor. Each of the transistors T1 to T7 may be one of a PMOS transistor and an NMOS transistor. In an embodiment, the first transistor T1 as a driving transistor, the second transistor T2 as a data transfer transistor, the third transistor T3 as a compensating transistor, the fourth transistor as a first initializing transistor, the fifth transistor T5 as a first emission control transistor, the sixth transistor T6 as a second emission control transistor, and the seventh transistor T7 as a second initializing transistor all are PMOS transistors.

It should be understood, however, that the embodiment described herein is not limited thereto. For example, the third transistor T3 as the compensating transistor and the fourth transistor T4 as the first initializing transistor may be NMOS transistors, and the first transistor T1 as the driving transistor, the second transistor T2 as the data transfer transistor, the fifth transistor T5 as the first emission control transistor, the sixth transistor T6 as the second emission control transistor, and the seventh transistor T7 as the second initializing transistor may be PMOS transistors. In such case, the active layers of the third transistor T3 and the fourth transistor T4 may include a different material from that of the active layers of the first transistor T1, the second transistor T2, the fifth transistor T5, the sixth transistor T6 and the seventh transistor T7. Although not limited thereto, for example, the active layers of the third transistor T3 and the fourth transistor T4 may include oxide semiconductor, and the active layers of the first transistor T1, the second transistor T2, the fifth transistor T5, the sixth transistor T6 and the seventh transistor T7 may include polycrystalline silicon.

Hereinafter, each of the elements will be described in detail.

The gate electrode of the first transistor T1 is connected to a first electrode of a capacitor Cst. The first electrode of the first transistor T1 is connected to a first supply voltage ELVDD via the fifth transistor T5. The second electrode of the first transistor T1 is connected to the anode electrode of the light-emitting element LE via the sixth transistor T6. The first transistor T1 receives the data signal DATA according to the switching operation of the second transistor T2 to supply the driving current to the light-emitting diode LE.

The gate electrode of the second transistor T2 is connected to a first scan signal GW line. The first electrode of the second transistor T2 is connected to the data signal DATA line. The second electrode of the second transistor T2 is connected to the first electrode of the first transistor T1. The second transistor T2 is turned on according to the first scan signal GW and performs a switching operation to transfer the data signal DATA to the first electrode of the first transistor T1.

The third transistor T3 may be implemented as a dual transistor including a first subsidiary transistor T3-1 and a second subsidiary transistor T3-2. The gate electrode of the first subsidiary transistor T3_1 is connected to the first scan signal GW line, the first electrode is connected to the second electrode of the second subsidiary transistor T3_2, and the second electrode is connected to the first electrode of the capacitor Cst, the first electrode of the third subsidiary transistor T4_1, and the gate electrode of the first transistor T1. The gate electrode of the second subsidiary transistor T3_2 may be connected to the first scan signal GW line, the first electrode may be connected to the second electrode of the first transistor T1, and the second electrode may be connected to the first electrode of the first subsidiary transistor T3_1.

The first subsidiary transistor T3_1 and the second subsidiary transistor T3_2 are turned on by the first scan signal GW to connect the gate electrode and the second electrode of the first transistor T1 so that the first transistor T1 is in diode connection. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal DATA that compensates for the threshold voltage to the gate electrode of the first transistor T1.

The fourth transistor T4 may be implemented as a dual transistor including a third subsidiary transistor T4_1 and a fourth subsidiary transistor T4_2. The gate electrode of the third subsidiary transistor T4_1 is connected to the second scan signal GI line, the first electrode is connected to the first electrode of the capacitor Cst, the second electrode of the first subsidiary transistor T3_1 and the gate electrode of the first transistor T1, and the second electrode is connected to the first electrode of the fourth subsidiary transistor T4_2. The gate electrode of the fourth subsidiary transistor T4_2 may be connected to the second scan signal GI line, the first electrode may be connected to the second electrode of the third subsidiary transistor T4_1, and the second electrode may be connected to the initialization voltage VINT. The third subsidiary transistor T4_1 and the fourth subsidiary transistor T4_2 is turned on in response to the second scan signal GI to transfer the initialization voltage VINT to the gate electrode of the first transistor T1, to initialize the voltage at the gate electrode of the first transistor T1. The gate electrode of the fifth transistor T5 is connected to the emission control signal EM line, the first electrode is connected to the first supply voltage line ELVDDL, and the second electrode is connected to the first electrode osd2f the first transistor T1. The fifth transistor T5 is turned on by the emission control signal EM to connect the first electrode of the first transistor T1 with the first supply voltage line ELVDDL.

The sixth transistor T6 is connected between the second electrode of the first transistor T1 and the first electrode of the light-emitting element LE. The gate electrode of the sixth transistor T6 is connected to the emission control signal EM line, the first electrode is connected to the second electrode of the first transistor T1 and the first electrode of the second subsidiary transistor T3_2, and the second electrode is connected to the first electrode of the light-emitting element LE.

The fifth transistor T5 and the sixth transistor T6 are simultaneously turned on in response to the emission control signal EM so that the driving current flows through the light-emitting diode LE.

The gate electrode of the seventh transistor T7 is connected to the third scan signal GB line. The first electrode of the seventh transistor T7 is connected to the anode electrode of the light-emitting diode LE. The second electrode of the seventh transistor T7 is connected to the initialization voltage VINT line. The seventh transistor T7 is turned on according to the third scan signal GB to initialize the anode electrode of the organic light-emitting diode OLED.

Although the third scan signal GB is applied to the gate electrode of the seventh transistor T7 in this embodiment, the pixel circuit may be configured such that the emission control signal EM or the second scan signal GI is applied to the gate electrode of the seventh transistor T7 in other implementations.

The capacitor Cst is formed between the gate electrode of the first transistor T1 and the first supply voltage line ELVDDL, and includes a first electrode and a second electrode. The first electrode of the capacitor Cst may be connected to the gate electrode of the first transistor T1, the second electrode of the third transistor T3, and the first electrode of the fourth transistor T4, and the second electrode of the capacitor Cst may be connected to the first supply voltage line ELVDDL. The capacitor Cst may be used to regulate the data voltage applied to the gate electrode of the first transistor T1.

The cathode electrode of the light-emitting element LE is connected to a second supply voltage line ELVSSL, and receives the second supply voltage ELVSS from the second supply voltage line ELVSSL. The light-emitting element LE displays an image by receiving a driving current from the first transistor T1 to emit light.

Hereinafter, a planar structure and a cross-sectional structure of the above-described pixel PX will be described in detail.

Figure 4:
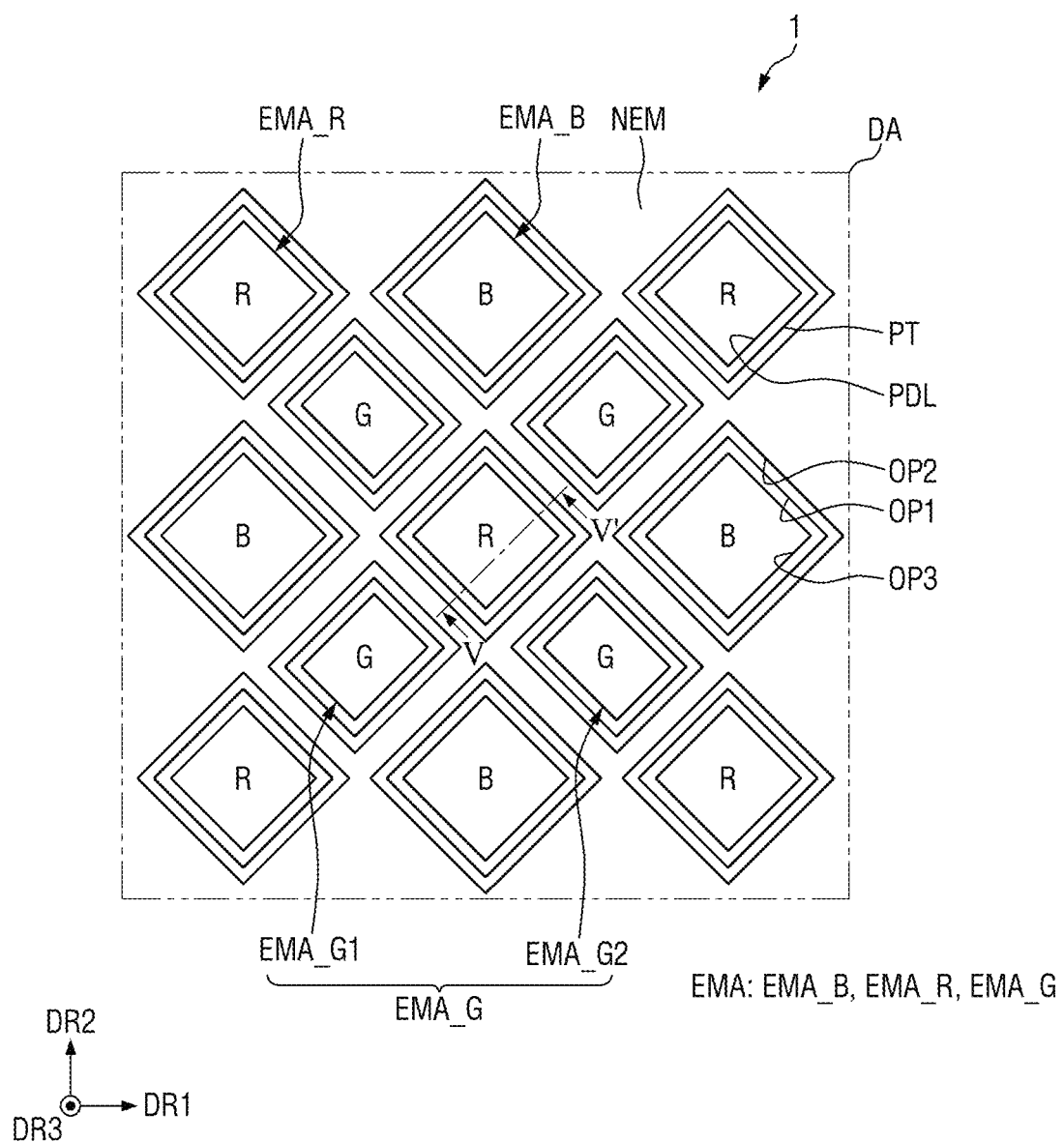
FIG. 4 is an enlarged plan view of a display area according to an embodiment.

FIG. 4 is an enlarged plan view of a display area according to an embodiment.

Referring to FIG. 4, each pixel PX (see FIG. 3) includes emission areas EMA and a non-emission area NEM. The pixels may include first color pixels (e.g., red pixels), second color pixels (e.g., blue pixels), and third color pixels (e.g., green pixels). The emission areas EMA may include emission areas EMA_R, EMA_B, EMA_G: EMA_G1, EMA_G2 of different color pixels. The emission areas EMA of different color pixels may have, but is not limited to, a generally rectangular shape when viewed from the top. The emission areas EMA of different color pixels may have an octagonal shape, a rectangular shape with rounded corners or a diamond shape when viewed from the top.

The non-emission area NEM is disposed between the emission areas EMA of different pixels. The non-emission area NEM may surround the emission areas EMA. The non-emission area NEM may include a grid shape or a mesh shape arranged along the diagonal directions intersecting the first direction DR1 and the second direction DR2 when viewed from the top.

In an embodiment, the emission areas EMA_R of the first color pixels and the emission areas EMA_B of the second color pixels may have similar shapes such as a diamond shape with rounded corners. The emission areas EMA_B of the second color pixels may be larger than the emission areas EMA_R of the first color pixels.

The emission areas EMA_G of the third color pixels may be smaller than the emission areas EMA_R of the first color pixels. The emission areas EMA_G of the third color pixels may have a quadrangular shape that is inclined in a diagonal direction and having the maximum width in the inclined direction. The third color pixels may include third color pixels in which emission areas EMA_G1 are inclined in a first diagonal direction, and third color pixels in which emission areas EMA_G2 are inclined in a second diagonal direction.

The emission areas EMA of the color pixels may be arranged in a variety of ways. In an embodiment, the emission areas EMA_R of the first color pixels and the emission areas EMA_B of the second color pixels may be alternately arranged in the first direction DR1 to form a first row, while the emission areas EMA_G of the third color pixels may be arranged in the first direction DR1 to form a second row next to the first row. The emission areas EMA belonging to the second row may be arranged such that they are staggered with the emission areas EMA belonging to the first row in the first direction DR1. In the second row, the emission areas EMA_G1 of the third color pixels that are inclined in the first diagonal direction and the emission areas EMA_G2 of the third color pixels that are inclined in the second diagonal direction may be alternately arranged in the first direction DR1. The number of emission areas EMA_G of the third color pixels in the second row may be twice the number of emission areas EMA_R of the first color pixels or the number of emission areas EMA_B of the second color pixels in the first row.

In a third row, the color pixels of the same colors as those of the first row may be arranged in the alternating order. Specifically, in a column where the emission area EMA_R of the first color pixel is disposed in the first row, the emission area EMA_B of the second color pixel may be disposed in the third row of the same column. In a column where the emission area EMA_B of the second color pixel is disposed in the first row, the emission area EMA_R of the first color pixel may be disposed in the third row of the same column. In the fourth row, the emission areas EMA_G of the third color pixels are arranged like the second row but they may have different shapes inclined in different diagonal directions. Specifically, in a column where the emission areas EMA_G1 of the third color pixels inclined in the first diagonal direction are disposed in the second row, the emission areas EMA_G2 of the third color pixels inclined in the second diagonal direction may be disposed in the fourth row of the same column. In a column here the emission area EMA_G2 of the third color pixel inclined in the second diagonal direction is disposed in the second row, the emission area EMA_G1 of the third color pixel inclined in the first diagonal direction may be disposed in the fourth row of the same column.

Figure 6:
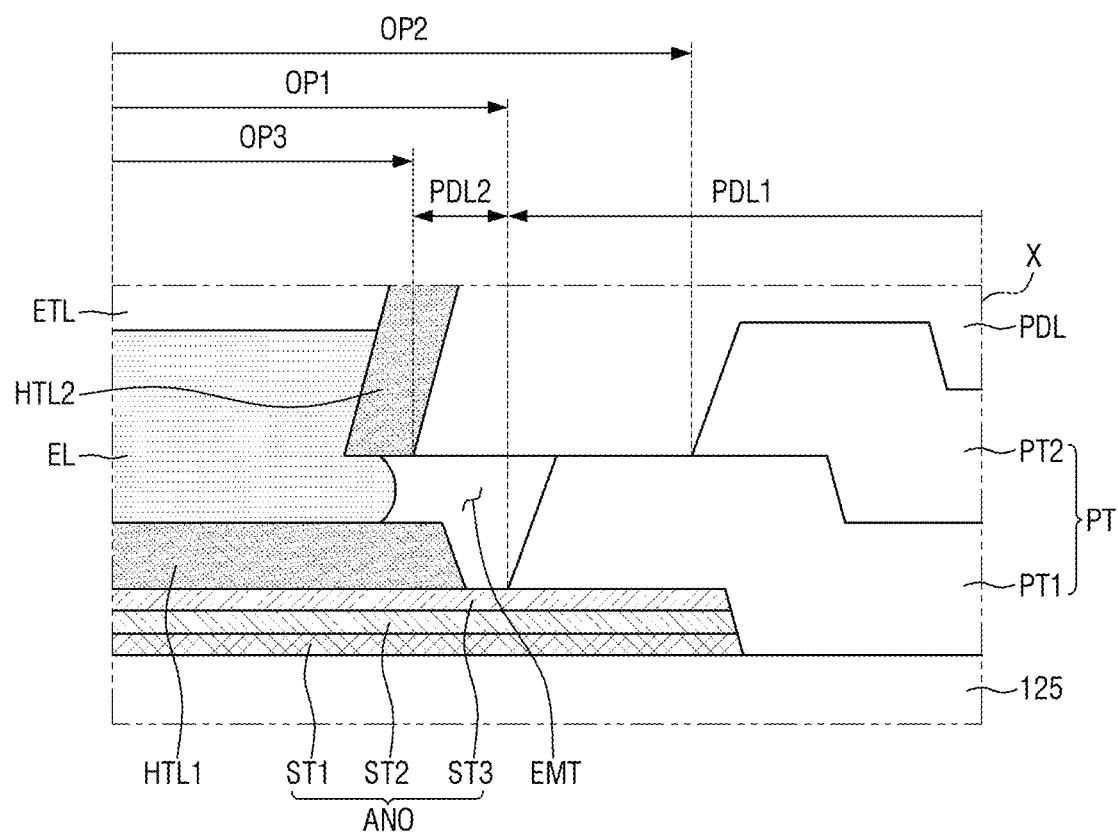
FIG. 6 is an enlarged view of area X of FIG. 5.

FIG. 5 is a cross-sectional view of a display panel of a pixel according to an embodiment. FIG. 6 is an enlarged view of area X of FIG. 5. FIG. 5 shows a cross-section around the emission area EMA_R of the first color pixel, and a cross-section of one pixel will be described based on this. It should be noted that the description on the emission area EMA_R can be equally applied to the emission areas EMA_B and EMA_G of the other color pixels.

Referring to FIGS. 4 to 6, the display panel 10 may include a substrate SUB, a buffer layer BF, a semiconductor layer 110, a first insulating layer (a first inorganic insulating layer) 121, a first conductive layer 130, a second insulating layer (a second inorganic insulating layer) 122, a second conductive layer 140, a third insulating layer (a third inorganic insulating layer) 123, a third conductive layer 150, a fourth insulating layer (first organic insulating layer) 124, a fourth conductive layer 160, a fifth insulating layer (a second organic insulating layer) 125, an anode electrode ANO, an anti-contact layer PT, a pixel-defining layer PDL, an organic layer PL, a cathode electrode CAT, and an encapsulation layer 180. The layers may be stacked on one another in the above described order. Each of the layers may be made up of a single layer, or a stack of layers including a plurality of layers. Other layers may be further disposed between the layers.

The substrate SUB supports the layers disposed thereon. A transparent substrate may be used when the organic light-emitting display device is of a bottom-emission or both-sided emission type. When the organic light-emitting display device is of a top-emission type, a semitransparent or opaque substrate as well as a transparent substrate may be employed.

The substrate SUB may be a rigid substrate or a flexible substrate that can be bent, folded, rolled, and so on. An example of the material of the flexible substrate may be, but is not limited to, polyimide (PI).

The buffer layer BF may be disposed on the substrate SUB. The buffer layer BF may prevent impurity ions from diffusing, may prevent permeation of moisture or outside air, and may provide a flat surface. The buffer layer BF may include, but is not limited to, silicon nitride. It may include silicon oxide, silicon oxynitride, etc. The buffer layer BF may be eliminated depending on the type of the substrate SUB, process conditions, etc.

The semiconductor layer 110 is disposed on the buffer layer BF. The semiconductor layer 110 forms a channel of a thin-film transistor of the pixel. The semiconductor layer 110 may include polycrystalline silicon. It is, however, to be understood that the embodiment described herein is not limited thereto. The semiconductor layer 110 may include monocrystalline silicon, low-temperature polycrystalline silicon, amorphous silicon, or an oxide semiconductor. The oxide semiconductor may include, for example, a binary compound ($AB_x$), a ternary compound ($AB_xC_y$) and a quaternary compound ($AB_xC_yD_z$) containing indium, zinc, gallium, tin, titanium, aluminum, hafnium (Hf), zirconium (Zr), magnesium (Mg), etc.

The first insulating layer 121 is disposed on the semiconductor layer 110. The first insulating layer 121 may be a first gate insulating film having gate insulating features. The first insulating layer 121 may include an inorganic insulating material. The first insulating layer 121 may include a silicon compound, a metal oxide, etc. For example, the first insulating layer 121 may include silicon oxide, silicon nitride, silicon oxynitride, aluminum oxide, tantalum oxide, hafnium oxide, zirconium oxide, titanium oxide, etc.

The first conductive layer 130 is disposed on the first insulating layer 121. The first conductive layer 130 may include a gate electrode GAT of a thin-film transistor of a pixel and a scan line connected thereto, a first electrode CE1 of a storage capacitor Cst.

The first conductive layer 130 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer 122 may be disposed on the first conductive layer 130. The second insulating layer 122 may be an interlayer dielectric layer or a second gate insulating layer. The second insulating layer 122 may include an inorganic insulating material. The second insulating layer 122 may be made of, but is not limited to, the same material as the first insulating layer 121.

The second conductive layer 140 is disposed on the second insulating layer 122. The second conductive layer 140 may include a second electrode CE2 of the storage capacitor Cst. The second conductive layer 140 may be made of, but is not limited to, the same material as the first conductive layer 130.

The third insulating layer 123 is disposed on the second conductive layer 140. The third insulating layer 123 may be an interlayer dielectric layer. The third insulating layer 123 may include an inorganic insulating material. The third insulating layer 123 may be made of, but is not limited to, the same material as the first insulating layer 121.

The third conductive layer 150 is disposed on the third insulating layer 123. The third conductive layer 150 may include a first electrode SD1 and a second electrode SD2 of the thin-film transistor of the pixel. The first electrode SD1 and the second electrode SD2 of the thin film transistor may be electrically connected to the source region and the drain region of the semiconductor layer 110, respectively, through contact holes passing through the third insulating layer 123, the second insulating layer 122 and the first insulating layer 121. The first supply voltage line ELVDDL of the pixel may also be formed of the third conductive layer 150. The first supply voltage line ELVDDE may be electrically connected to the second electrode CE2 of the storage capacitor Cst through a contact hole penetrating through the third insulating layer 123.

The third conductive layer 150 may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 150 may include a stack of multiple layers stacked on one another. For example, the third conductive layer 150 may have a stack structure of Ti/Al/Ti, Mo/Al/Mo, Mo/AlGe/Mo, Ti/Cu, etc.

The fourth insulating layer 124 is disposed on the third conductive layer 150. The fourth insulating layer 124 covers the third conductive layer 150. The fourth insulation layer 124 may be a via layer. The fourth insulating layer 124 may include an organic insulating material. For example, the fourth insulating layer 124 may include polyacrylate resin, epoxy resin, phenolic resin, polyamide resin, polyimide resin, unsaturated polyesters resin, poly phenylen ether resin, poly phenylene sulfide resin, benzocyclobutene (BCB), etc.

The fourth conductive layer 160 is disposed on the fourth insulating layer 124. The fourth conductive layer 160 may include an anode connection electrode CNE. The anode connection electrode CNE may be electrically connected to the second electrode SD2 of the thin-film transistor through a contact hole penetrating through the fourth insulating layer 124. The anode connection electrode CNE may electrically connect the anode electrode ANO with the second electrode SD2 of the thin-film transistor. The fourth conductive layer 160 may include the same material as the third conductive layer 150 or may include the same stack structure, but the embodiment described herein is not limited thereto.

The fifth insulating layer 125 is disposed on the fourth conductive layer 160. The fifth insulating layer 125 covers the fourth conductive layer 160. The fifth insulation layer 125 may be a via layer. The fifth insulating layer 125 may include an organic insulating material. The fifth insulating layer 125 may be made of, but is not limited to, the same material as the fourth insulating layer 124.

The anode electrode ANO is disposed on the fifth insulating layer 125. The anode electrode ANO may be a pixel electrode disposed in each of the pixels. The anode electrode ANO may be connected to the anode connection electrode CNE through a contact hole penetrating the fifth insulating layer 125. The anode electrode ANO may at least partially overlap the emission area EMA of the pixel.

The anode electrode ANO may have, but is not limited to, a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a mixture thereof. The layer having a high work function may be disposed above the reflective material layer so that it is disposed closer to the organic layer OL.

The anode electrode ANO may have a multi-layer structure. The anode electrode ANO may include a first stacked conductive layer ST1, a second stacked conductive layer ST2 and a third stacked conductive layer ST3 that are stacked on one another in this order. The first stacked conductive layer ST1, the second stacked conductive layer ST2 and the third stacked conductive layer ST3 may include different materials. The first stacked conductive layer ST1 and the third stacked conductive layer ST3 may include amorphous indium-tin-oxide (ITO), and the second stacked conductive layer ST2 may include silver (Ag). It should be understood, however, that the embodiment described herein is not limited thereto. The anode electrode ANO may have a multi-layer structure such as ITO/Mg, ITO/MgF and ITO/Ag.

The anti-contact layer PT may be disposed on the anode electrode ANO. The anti-contact layer PT may include a first anti-contact layer PT1 and a second anti-contact layer PT2 sequentially stacked on one another. The first anti-contact layer PT1 and the second anti-contact layer PT2 may include different inorganic materials. The first anti-contact layer PT1 may include molybdenum trioxide ($MoO_3$), and the second anti-contact layer PT2 may include molybdenum dioxide ($MoO_2$). During the fabricating process, the anti-contact layer PT may cover the anode electrode ANO, and thus it is possible to suppress or prevent the delamination between the second stacked conductive layer ST2 and the third stacked conductive layer ST3 of the anode electrode ANO. In addition, it is possible to suppress or prevent defects such as dark spots. Detailed descriptions thereon will be given later.

The first anti-contact layer PT1 and the second anti-contact layer PT2 may include different materials, and may have different electrical resistance and light transmittance.

The first anti-contact layer PT1 may have a greater electrical resistance than the second anti-contact layer PT2. The first anti-contact layer PT1 may have a smaller electrical conductivity than the second anti-contact layer PT2. The first anti-contact layer PT1 may substantially work as an insulating film. The first anti-contact layer PT1 may overlap the entire area of the second anti-contact layer PT2 in the thickness direction (the third direction DR3). The first anti-contact layer PT1 may be disposed between the second anti-contact layer PT2 and the anode electrode ANO. Even though the second anti-contact layer PT2 has conductivity, the second anti-contact layer PT2 and the anode electrode ANO can be electrically insulated by the first anti-contact layer PT1. Accordingly, even though the second anti-contact layer PT2 is disposed on the anode electrode ANO and the second anti-contact layer PT2 has conductivity, the anode electrode ANO can be electrically insulated from another adjacent anode electrode ANO.

The second anti-contact layer PT2 may have a lower light transmittance than the first anti-contact layer PT1. The second anti-contact layer PT2 may have a greater light absorption than the first anti-contact layer PT1. The thickness of the second anti-contact layer PT2 may be in the range of 1,000 Å to 9,000 Å, or may be in the range of 2,000 Å to 5,000 Å.

As long as the thickness of the second anti-contact layer PT2 lies within the above ranges, the second anti-contact layer PT2 can substantially work as a light-blocking film.

This will be described in more detail with reference to FIG. 7.

Figure 7:
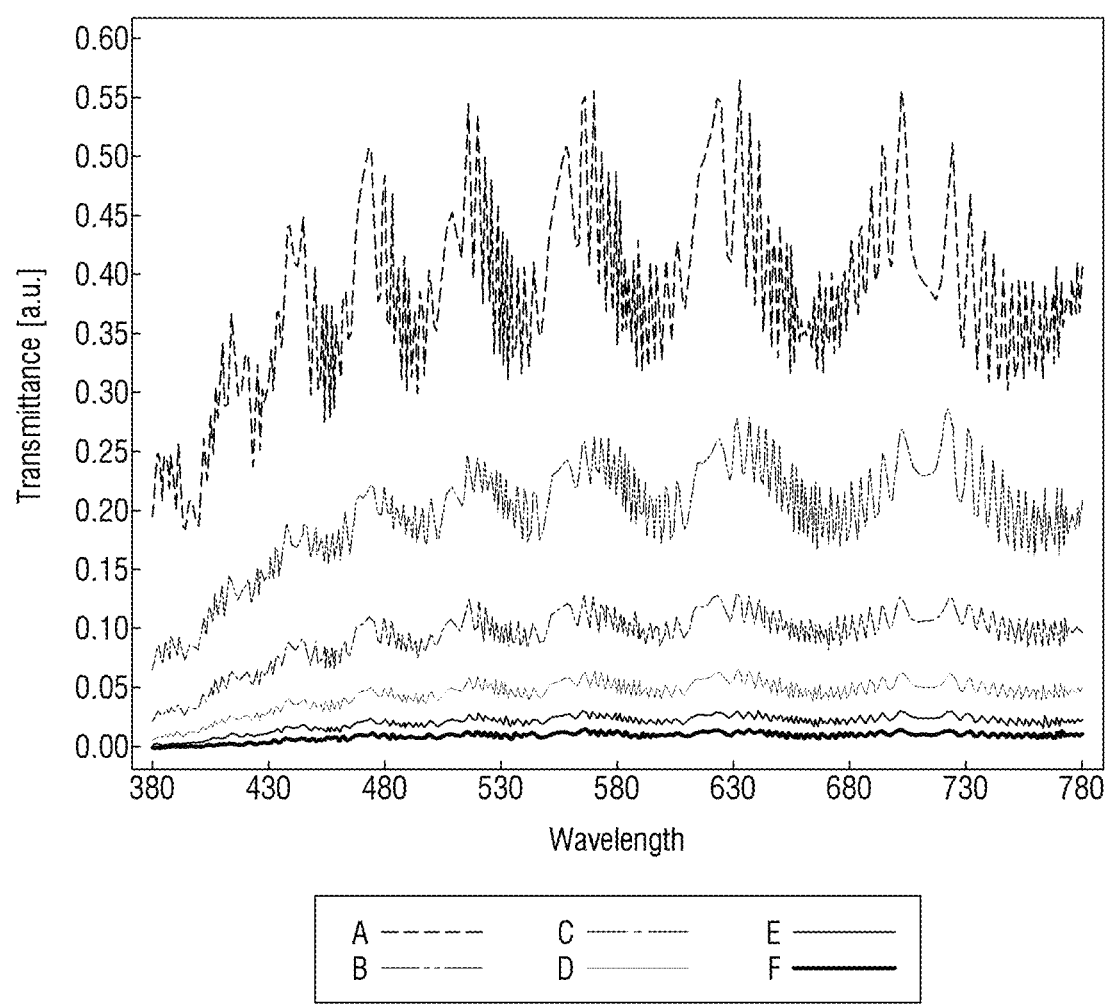
FIG. 7 is a graph showing light transmittance versus thickness of the second anti-contact layer according to Examples and Comparative Examples.

FIG. 7 is a graph showing light transmittance versus thickness of the second anti-contact layer according to the Examples and Comparative Examples. The horizontal axis (x-axis) represents the wavelength of light, and the vertical axis (y-axis) represents the light transmittance in a.u.

In the graph shown in FIG. 7, line A represents an example where the thickness of the second anti-contact layer PT2 is 500 Å, line B represents an example where the thickness of the second anti-contact layer PT2 is 1,000 Å, line C represents an example where the thickness of the second anti-contact layer PT2 is 1,500 Å, line D represents an example where the thickness of the second anti-contact layer PT2 is 2,000 Å, line E represents an example where the thickness of the second anti-contact layer PT2 is 2,500 Å, line F represents an example where the thickness of the second anti-contact layer PT2 is 3,000 Å.

Referring further to FIG. 7, as the thickness of the second anti-contact layer PT2 increases, the light transmittance decreases. In the example indicated by line A, the light transmittance is approximately 0.35 in a.u. on average, although there are deviations depending on the wavelength of light. In the example indicated by line B, the light transmittance is approximately 0.20 in a.u. on average, although there are deviations depending on the wavelength of light. In the example indicated by line C, the light transmittance is approximately 0.10 in a.u. on average, although there are deviations depending on the wavelength of light. In the example indicated by line D, the light transmittance is approximately 0.04 in a.u. on average, although there are deviations depending on the wavelength of light. In the example indicated by line E, the light transmittance is approximately 0.02 in a.u. on average, although there are deviations depending on the wavelength of light. In the example indicated by line F, the light transmittance is approximately 0.01 in a.u. on average, although there are deviations depending on the wavelength of light. Accordingly, as long as the thickness of the second anti-contact layer PT2 lies within the above ranges, the second anti-contact layer PT2 can substantially work as a light-blocking film.

TABLE 1

|  | Comparative Examples | | | Examples | | |
| --- | --- | --- | --- | --- | --- | --- |
| Wavelength | 450 mm | 550 mm | 650 mm | 450 mm | 550 mm | 650 mm |
| Light Reflectance (%) | 73 | 96 | 98 | 12 | 12 | 10 |
| Light Transmittance (%) | 77 | 87 | 84 | 4 | 5 | 6 |

In Table 1, no anti-contact layer is disposed under the pixel-defining layer PDL in the Comparative Examples, whereas the anti-contact layer PT is disposed under the pixel-defining layer PDL in the Examples, and the thickness of the second anti-contact layer PT2 is 2,000 Å.

In the Comparative Examples, the light reflectance refer to the ratio of the amount of light that is reflected off the anode electrode ANO and exits through the pixel-defining layer PDL to the amount of total light incident on the anode electrode ANO through the pixel-defining layer PDL. The light transmittance refers to the ratio of the amount of the light that travels upward through the pixel-defining layer PDL to the amount of the total light that is incident on the pixel-defining layer PDL from below.

In the Examples, the light reflectance refer to the ratio of the amount of light that is reflected off the anode electrode ANO and exits through the pixel-defining layer PDL and the anti-contact layer PT (or the second anti-contact layer PT2) to the amount of total light incident on the anode electrode ANO through the pixel-defining layer PDL and the anti-contact layer PT (or the second anti-contact layer PT2). In the Examples, light transmittance refers to the ratio of the amount of the light that travels upward through the pixel-defining layer PDL and the anti-contact layer PT (or the second anti-contact layer PT2) to the amount of the total light that is incident on the pixel-defining layer PDL and the anti-contact layer PT (or the second anti-contact layer PT2) from below.

Comparing the Comparative Examples with the Examples, the light reflectance and light transmittance are lower in Examples than in Comparative Examples at different wavelengths. Accordingly, by disposing the second anti-contact layer PT2, it is possible to block light traveling through the pixel-defining layer PDL or light incident toward the anode electrode ANO and light reflected by the anode electrode ANO by the second anti-contact layer PT2. Accordingly, even though the pixel-defining layer PDL does not include a dye or pigment, it is possible to suppress or prevent that light incident from the outside of the display device or light emitted from the emissive layer EL is reflected by other elements of the display device and noticeable from the outside. In addition, it is possible to suppress or prevent deterioration of the reflected colors, and to suppress or prevent deterioration of the color gamut.

Referring back to FIGS. 4 to 6, the first anti-contact layer PT1 may define a first opening OP1. The first opening OP1 may penetrate the first anti-contact layer PT1 in the thickness direction (the third direction DR3). The first opening OP1 may expose the anode electrode ANO. The first opening OP1 may be disposed outside a third opening OP3 and may surround the third opening OP3 when viewed from the top.

The second anti-contact layer PT2 may define a second opening OP2. The second opening OP2 may penetrate the second anti-contact layer PT2 in the thickness direction (the third direction DR3). The second opening OP2 may expose the anode electrode ANO. The second opening OP2 may be disposed outside the first opening OP1 and the third opening OP3 and may surround the first opening OP1 and the third opening OP3 when viewed from the top.

Side surfaces of the first anti-contact layer PT1 may protrude outward from side surfaces of the second anti-contact layer PT2. In other words, the side surfaces of the first anti-contact layer PT1 defining the inner walls of the first opening OP1 may protrude outward from the side surfaces of the second anti-contact layer PT2 defining the inner walls of the second opening OP2.

As used herein, the phrase that a side surface protrudes outward denotes that the side surface protrudes toward the side surface facing it in a cross-sectional view. In other words, one side surface of the first anti-contact layer PT1 may protrude toward another side surface facing it in the cross-sectional view, one side surface of the second anti-contact layer PT2 may protrude toward another side surface facing it in cross-sectional view, and the one side surface of the first anti-contact layer PT1 may protrude more than the one side surface of the second anti-contact layer PT2. In this instance, the second opening OP2 may expose the first anti-contact layer PT1.

The pixel-defining layer PDL may be disposed on the anti-contact layer PT. The pixel-defining layer PDL may be disposed on the second anti-contact layer PT2, and may be disposed on one surface (upper surface) and the side surfaces of the second anti-contact layer PT2. The pixel-defining layer PDL may cover one surface (upper surface) and the side surfaces of the second anti-contact layer PT2. The height of the opposite surface (lower surface) of the pixel-defining layer PDL may be substantially equal to the height of the surface (upper surface) of the first anti-contact layer PT1 from one surface or the opposite surface of the substrate SUB. The emission area EMA and the non-emission area NEM may be distinguished by the pixel-defining layer PDL and the third opening OP3.

The pixel-defining layer PDL may define the third opening OP3. The third opening OP3 may pass through the pixel-defining layer PDL in the thickness direction (the third direction DR3). The third opening OP3 may expose the anode electrode ANO exposed by the first opening OP1. The third opening OP3 may overlap the first opening OP1 of the first anti-contact layer PT1 and the second opening OP2 of the second anti-contact layer PT2.

Side surfaces of the pixel-defining layer PDL may protrude outward from the side surfaces of the first anti-contact layer PT1. In other words, the side surfaces of the pixel-defining layer PDL defining the inner walls of the third opening OP3 may protrude outward from the side surfaces of the first anti-contact layer PT1 defining the inner walls of the first opening OP1. In addition, the side surfaces of the pixel-defining layer PDL defining the inner walls of the third opening OP3 may protrude outward from the side surfaces of the second anti-contact layer PT2 defining the inner walls of the second opening OP2.

The pixel-defining layer PDL may include an overlapping portion PDL1 overlapping with the anti-contact layer PT, and a non-overlapping portion PDL2 not overlapping with the anti-contact layer PT. The overlapping portion PDL1 and the non-overlapping portion PDL2 may be formed integrally. The overlapping portion PDL1 may overlap with at least one of the first anti-contact layer PT1 and the second anti-contact layer PT2 in the thickness direction (the third direction DR3). The non-overlapping portion PDL2 may not overlap the first anti-contact layer PT1 and the second anti-contact layer PT2 and may overlap the anode electrode ANO.

The non-overlapping portion PDL2 of the pixel-defining layer PDL may overlap the anode electrode ANO in the thickness direction (the third direction DR3) and may be spaced apart from the anode electrode ANO in the thickness direction (the third direction DR3). At least one of a first hole injection/transport layer HTL1 and an emissive layer EL may be disposed between the anode electrode ANO and the non-overlapping portion PDL2 of the pixel-defining layer PDL in the thickness direction (third direction DR3). In addition, a partial region between the non-overlapping portion PDL2 of the pixel-defining layer PDL and the anode electrode ANO in the thickness direction (the third direction DR3) may be filled with air.

In other words, the pixel-defining layer PDL may include at least a region that is spaced apart from and faces the anode electrode ANO. In the region where the pixel-defining layer PDL and the anode electrode ANO are spaced apart from each other (the separation area EMT), the first hole injection/transport layer HTL1 and the light emitting layer EL may be at least partially interposed or air may be interposed. The separation area EMT may refer to the region that overlaps the pixel-defining layer PDL and the anode electrode ANO in the thickness direction (the third direction DR3), with no anti-contact layer PT between the pixel-defining layer PDL and the anode electrode ANO.

The pixel-defining layer PDL may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). It is, however, to be understood that the embodiment described herein is not limited thereto. The pixel-defining layer PDL may include an inorganic material.

The organic layer OL is disposed on the pixel-defining layer PDL, and is disposed in at least one of the first opening OP1 of the first anti-contact layer PT1, the second opening OP2 of the second anti-contact layer PT2 and the third opening OP3 of the pixel-defining layer PDL. The organic layer OL may be disposed on the anode electrode ANO exposed by the third opening OP3 of the pixel-defining layer PDL. The organic layer OL may include a hole injection/transport layer HTL, an emission layer EL, and an electron injection/transport layer ETL that are sequentially stacked on one another.

The hole injection/transport layer HTL may be disposed at the bottom of the organic layer OL. The hole injection/transport layer HTL can facilitate transportation of holes, and can facilitate injection of holes into the light-emitting element layer EL. Although the hole injection/transport layer HTL is made up of a single layer in the drawings, the embodiment described herein is not limited thereto. The hole injection layer and the hole transport layer may be implemented as two different layers.

The hole injection/transport layer HTL may include a first hole injection/transport layer HTL1 disposed on the anode electrode ANO exposed by the third opening OP3 of the pixel-defining layer PDL, and a second hole injection/transport layer HTL2 disposed on one surface (upper surface) and side surfaces (inner walls of the third opening OP3) of the pixel-defining layer PDL. The first hole injection/transport layer HTL1 and the second hole injection/transport layer HTL2 are separated from each other and may be spaced apart from each other. The first hole injection/transport layer HTL1 and the second hole injection/transport layer HTL2 may be electrically insulated from each other. The emissive layer EL may be disposed between the first hole injection/transport layer HTL1 and the second hole injection/transport layer HTL2.

More than one first hole injection/transport layers HTL1 may be disposed. Each of the plurality of first hole injection/transport layers HTL1 may include an island shape in a plan view. The first hole injection/transport layer HTL1 may be disposed in each of the emission areas EMA.

The second hole injection/transport layer HTL2 may be formed as a single piece. The second hole injection/transport layer HTL2 may be disposed in the non-emission area NEM. The second hole injection/transport layer HTL2 may surround the first hole injection/transport layer HTL1 when viewed from the top, but the embodiment described herein is not limited thereto. The second hole injection/transport layer HTL2 may overlap with the first hole injection/transport layer HTL1 in the thickness direction (third direction DR3).

The first hole injection/transport layer HTL1 and the second hole injection/transport layer HTL2 may be separated from each other by the separation area EMT. In other words, the first hole injection/transport layer HTL1 and the second hole injection/transport layer HTL2 may be formed together via a single process of forming the hole injection/transport layer HTL. In this instance, the pixel-defining layer PDL and the anode electrode ANO may be spaced apart from each other in the thickness direction (the third direction DR3), and the anti-contact layer PT is not disposed at a partial region between the pixel-defining layer PDL and the anode electrode ANO, so that the first hole injection/transport layer HTL1 and the second hole injection/transport layer HTL2 cannot be connected to each other but may be separated from each other.

As the first hole injection/transport layer HTL1 and the second hole injection/transport layer HTL2 are separated from each other, even though the hole injection/transport layer HTL is disposed across a plurality of pixels (or a plurality of emission areas EMA), the first hole injection/transport layer HTL1 disposed in each of the emission area EMA may be separated from another one and electrically insulated from it. In addition, separate doping may be carried out on the lower region of the hole injection/transport layer HTL to improve the efficiency of hole injection, and thus the lower region of the hole injection/transport layer HTL can have relatively high electrical conductivity after the doping. In this instance, as the first hole injection/transport layer HTL1 disposed in each of the emission areas EMA is separated and electrically insulated from another one, the efficiency of hole injection can be improved and lateral leakage current between adjacent pixels can be suppressed or prevented.

The emissive layer EL may be disposed on the hole injection/transport layer HTL. The emissive layer EL may be disposed on the first hole injection/transport layer HTL1. The emissive layer EL may be disposed in the third opening OP3 of the pixel-defining layer PDL. The emissive layer EL may be disposed in each of the emission areas EMA. The emissive layer EL may be disposed between the hole injection/transport layer HTL and the first electron injection/transport layer ETL1. The emissive layer EL can emit light as the holes provided from the first hole injection/transport layer HTL1 and the electrons provided from the electron injection/transport layer ETL react with one another.

At least a part of the emissive layer EL may be disposed in the separation area EMT. In other words, at least a part of the emissive layer EL may be used to fill between the anode electrode ANO and the pixel-defining layer PDL in the thickness direction (the third direction DR3). The emissive layer EL may overlap the anode electrode ANO and the pixel-defining layer PDL in the thickness direction (the third direction DR3). The other region of the separation area EMT that is not filled with the emissive layer EL may be filled with, but is not limited to, air.

The electron injection/transport layer ETL is disposed on the emissive layer EL. The electron injection/transport layer ETL may be disposed on the hole injection/transport layer HTL (or the second hole injection/transport layer HTL2) disposed on the pixel-defining layer PDL. The electron injection/transport layer ETL may be disposed at the top of the organic layer OL. The electron injection/transport layer ETL can facilitate transportation of electrons and can facilitate injection of electrons into the emissive layer EL. Although the electronic injection/transport layer ETL is made up of a single layer in the drawings, the embodiment described herein is not limited thereto. The electronic injection layer and the electronic transport layer may be implemented as two different layers.

The cathode electrode CAT may be disposed on the organic layer OL. The cathode electrode CAT may be a common electrode disposed across the pixels. The anode electrode ANO, the organic layer OL and the cathode electrode CAT may form an organic light-emitting element.

The cathode electrode CAT may be in contact with the organic layer OL as well as the upper surface of the pixel-defining layer PDL. The cathode electrode CAT may be formed conformally to the underlying elements to reflect the step difference of the underlying elements.

The cathode electrode CAT may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode CAT may further include a transparent metal oxide layer disposed on the material layer having a small work function.

The encapsulation layer 180 may be disposed on the cathode electrode CAT. The encapsulation layer 180 may include a first inorganic encapsulation film 181, an organic encapsulation film 182, and a second inorganic encapsulation film 183. The first inorganic encapsulation film 181 and the second inorganic encapsulation film 183 may be in contact with each other at the end of the encapsulation layer 180. The organic encapsulation film 182 can be encapsulated by the first inorganic encapsulation film 181 and the second inorganic encapsulation film 183.

Each of the first inorganic encapsulation film 181 and the second inorganic encapsulation film 183 may include an inorganic insulating material such as silicon nitride, silicon oxide and silicon oxynitride. The organic encapsulation film 182 may include an organic insulating material.

Hereinafter, a method of fabricating a display device according to an embodiment will be described.

FIGS. 8 to 14 are cross-sectional views for illustrating processing steps of a method of fabricating a display device according to an embodiment.

Figure 8:
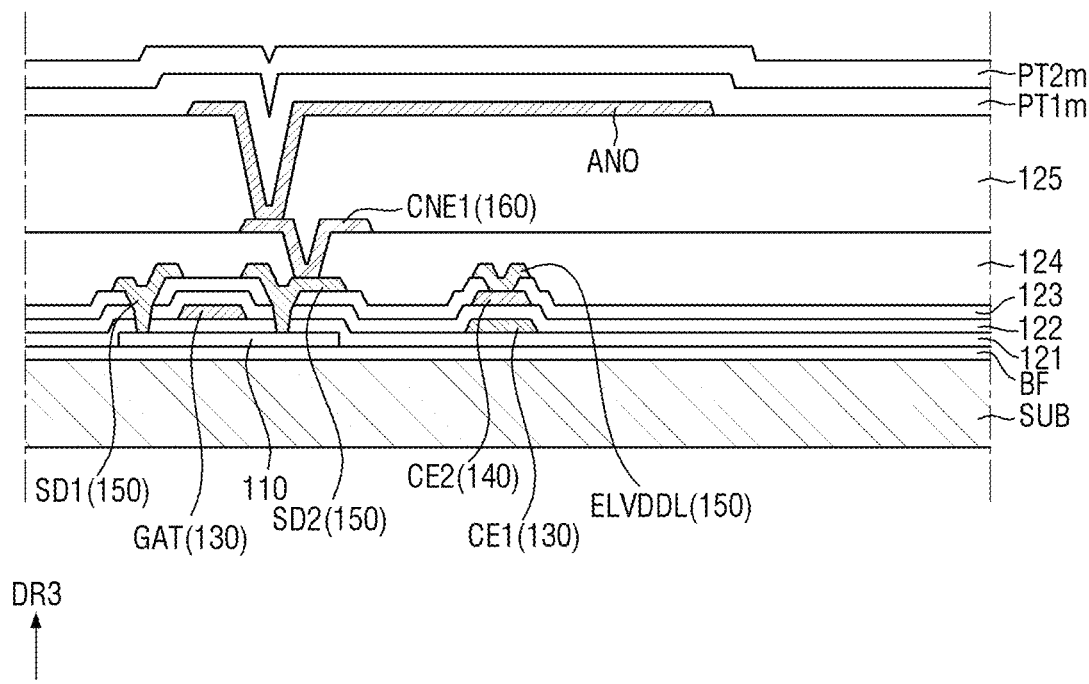
FIGS. 8, 9, 10, 11, 12, 13, and 14 are cross-sectional views for illustrating processing steps of a method of fabricating a display device according to an embodiment.

Referring first to FIG. 8, a substrate SUB, a buffer layer BF, a semiconductor layer 110, a first insulating layer 121, a first conductive layer 130, a second insulating layer 122, a second conductive layer 140, a third insulating layer 123, a third conductive layer 150, a fourth insulating layer 124, a fourth conductive layer 160, a fifth insulating layer 125 and an anode electrode ANO are formed sequentially. Each of the insulating layers may be formed over the entire area of the substrate SUB, and each of the conductive layers and the anode electrode ANO may be formed by patterning.

A material layer PT1$m$ for a first anti-contact layer and a material layer PT2$m$ for a second anti-contact layer are sequentially formed throughout the entire area of the fifth insulating layer 125 on which the anode electrode ANO is disposed. The material layer PT1$m$ for the first anti-contact layer may include molybdenum trioxide ($MoO_3$), and the material layer PT2$m$ for the second anti-contact layer may include molybdenum dioxide ($MoO_2$). The material layer PT1$m$ for the first anti-contact layer and the material layer PT2$m$ for the second anti-contact layer may be formed via, but is not limited to, a sputtering process.

When the material layer PT1$m$ for the first anti-contact layer and the material layer PT2$m$ for the second anti-contact layer are formed via a sputtering process, the material layer PT1$m$ for the first anti-contact layer and the material layer PT2$m$ for the second anti-contact layer may be formed via a single process. In other words, by controlling the oxygen (O2) concentration inside a chamber in which the sputtering process is carried out, the material layer PT1$m$ for the first anti-contact layer that contains molybdenum trioxide ($MoO_3$) and the material layer PT2$m$ for the second anti-contact layer that contains molybdenum dioxide ($MoO_2$) may be formed in a single chamber. Accordingly, process efficiency can be improved, and process cost can be reduced.

Figure 9:
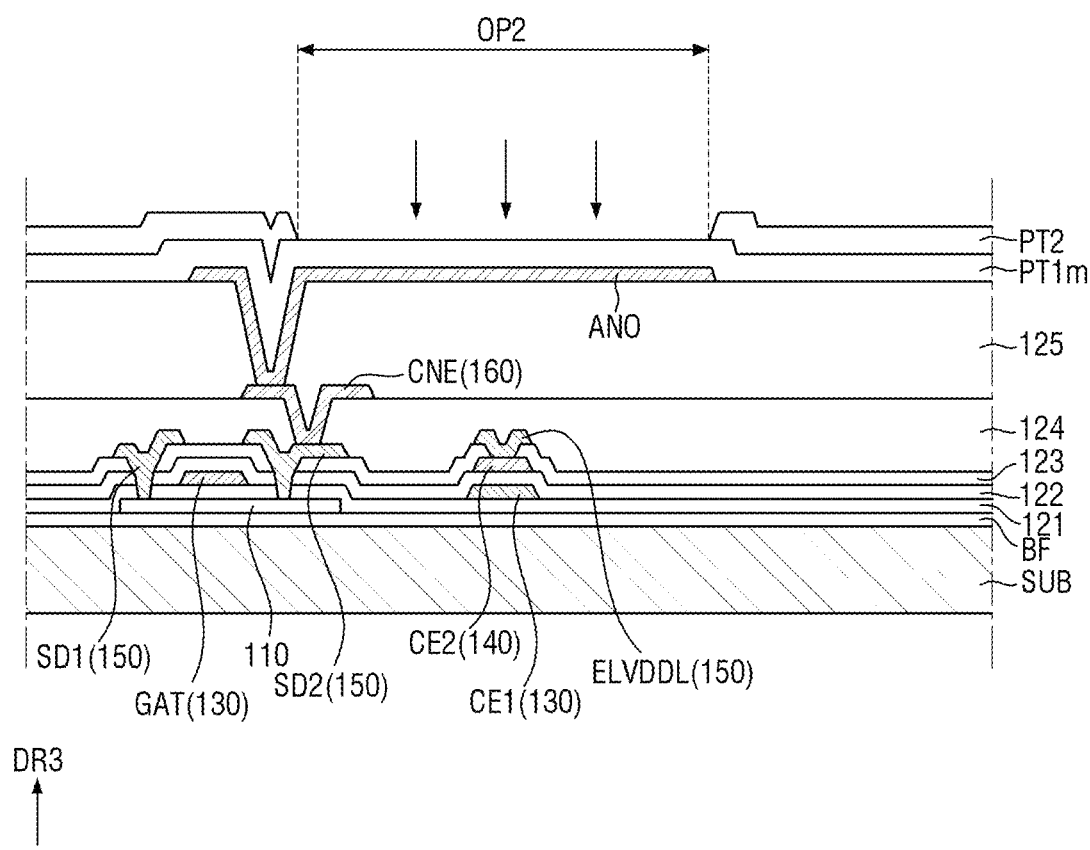

Subsequently, referring to FIG. 9, the material layer PT2$m$ for the second anti-contact layer (see FIG. 8) is patterned, so that the second anti-contact layer PT2 is formed. In doing so, a second opening OP2 defined by the second anti-contact layer PT2 may be formed. The second opening OP2 may expose the material layer PT1$m$ for the first anti-contact layer.

As the material layer PT2$m$ for the second anti-contact layer (see FIG. 8) is etched, the material layer PT2$m$ for the second anti-contact layer (see FIG. 8) forms a second opening OP2 penetrating in a partial region in the thickness direction. It should be understood, however, that the embodiment described herein is not limited thereto. For example, the material layer PT2m for the second anti-contact layer (see FIG. 8) may be etched to form a groove in a partial region of the material layer PT2m for the second anti-contact layer (see FIG. 8), or the material layer PT1m for the first anti-contact layer may be etched together with the material layer PT2m for the second anti-contact layer (see FIG. 8) to form a groove in a partial region of the material layer PT1m for the first anti-contact layer.

By etching out a partial region of the material layer PT2m for the second anti-contact layer (see FIG. 8), the separation area EMT (see FIG. 14) can be formed more efficiently. Detailed descriptions thereon will be given later.

Figure 10:
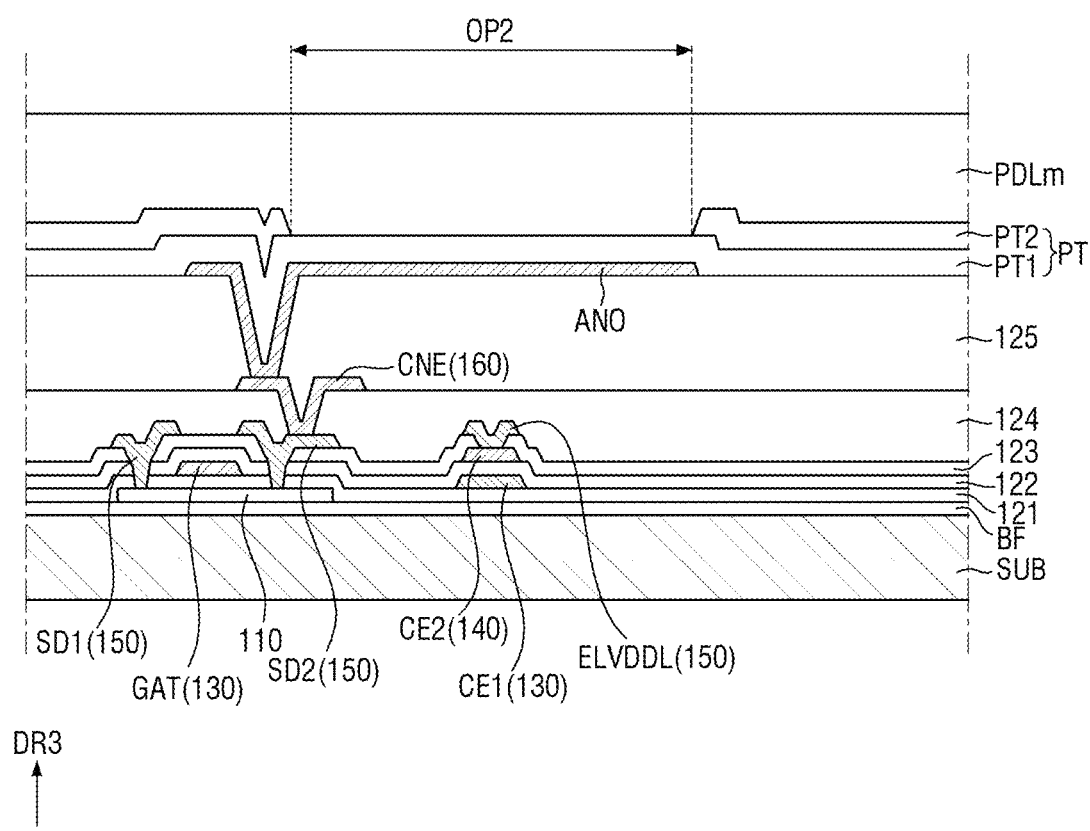
Figure 11:
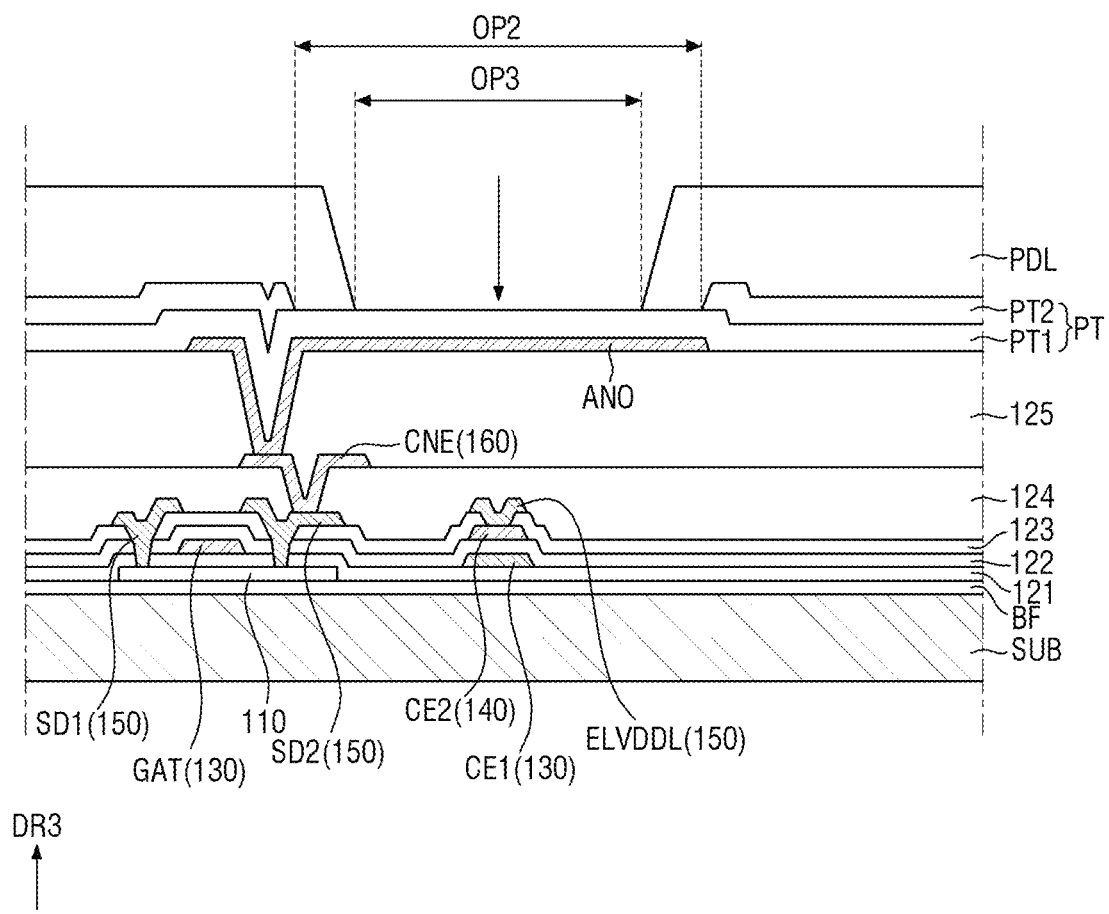

Subsequently, referring to FIGS. 10 and 11, a material layer PDLm for a pixel-defining layer is disposed on the second anti-contact layer PT2, and is exposed to light and developed, so that a pixel-defining layer PDL is formed. The material layer PDLm for the pixel-defining layer may be disposed throughout the entire area of the substrate SUB and may also be disposed on the material layer PT1m for the first anti-contact layer exposed by the second opening OP2. During the process of forming the pixel-defining layer PDL, a third opening OP3 defined by the pixel-defining layer PDL may be formed. The third opening OP3 may expose the material layer PT1m for the first anti-contact layer exposed by the second opening OP2.

As the material layer PT1m for the first anti-contact layer and the second anti-contact layer PT2 are disposed, the anode electrode ANO may not be in direct contact with the material layer PDLm for the pixel-defining layer. In other words, at least one of the material layer PT1m for the first anti-contact layer and the second anti-contact layer PT2 may be disposed between the anode electrode ANO and the material layer PDLm for the pixel-defining layer.

Accordingly, the anode electrode ANO can be protected from a developer used in the process of exposing the material layer PDLm for the pixel-defining layer to light and developing it. The anode electrode ANO may not be in direct contact with the developer used in the process of exposing the material layer PDLm for the pixel-defining layer to light and developing it. Therefore, it is possible to prevent the developer from permeation into the anode electrode ANO, and to suppress or prevent voids which may be created between the second stacked conductive layer ST2 (see FIG. 6) and the third stacked conductive layer ST3 (see FIG. 6) if the developer permeates into the anode electrode ANO. Furthermore, it is possible to suppress or prevent delamination between the second stacked conductive layer ST2 (see FIG. 6) and the third stacked conductive layer ST3 (see FIG. 6).

Figure 12:
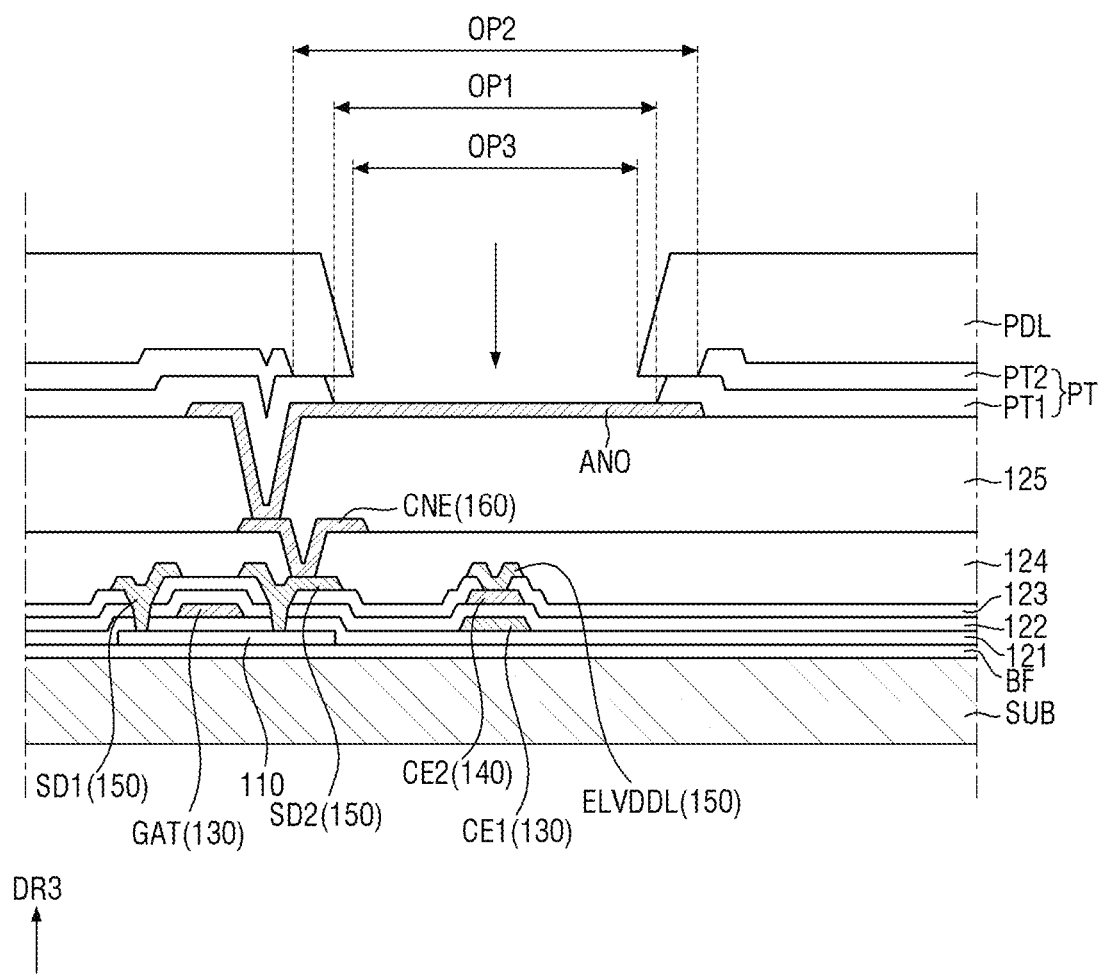

Subsequently, referring to FIG. 12, the material layer PT1m for the first anti-contact layer (see FIG. 11) is patterned, so that the first anti-contact layer PT21 is formed. During the process of forming the first anti-contact layer PT1, a first opening OP1 may be formed together. The material layer PT1m for the first anti-contact layer (see FIG. 11) may be etched by the developer used in the process of exposing the material layer PDLm for the pixel-defining layer to the light and developing it, or by the cleaning solution used in a cleaning process after exposure and development of the material layer PDLm for the pixel-defining layer. The developer contains tetramethylammonium hydroxide (TMAH), and the cleaning solution may include deionized water (DIW). It should be understood, however, that the embodiment described herein is not limited thereto.

The material layer PT1m for the first anti-contact layer (see FIG. 11) may be removed by etching the region exposed by the pixel-defining layer PDL and the periphery. Accordingly, the side surfaces of the first opening OP1 may be disposed more to the outside of the anode electrode ANO than the side surfaces of the third opening OP3, and an separation area EMT (see FIG. 5) may be formed between the pixel-defining layer PDL and the anode electrode ANO. In other words, the side surfaces of the third opening OP3 may protrude outward from the side surfaces of the first opening OP1. As a partial region of the material layer PT2m for the second anti-contact layer (see FIG. 8) is etched out, the thickness of the region of the material layer PT1m for the first anti-contact layer (see FIG. 11) that is exposed by the pixel-defining layer PDL (or the thickness of the material layer PT1m for the first anti-contact layer (see FIG. 11) and the thickness of the material layer PT2m for the second anti-contact layer (see FIG. 8) can be reduced, so that patterning can become easier.

When the material layer PT1m for the first anti-contact layer includes molybdenum trioxide ($MoO_3$) and the material layer PT2m for the second anti-contact layer includes molybdenum dioxide ($MoO_2$), no additional process of etching the material layer PT1m for the first anti-contact layer (see FIG. 11) may be required. In other words, when the material layer PT1m for the first anti-contact layer (see FIG. 11) is etched by the developer used in the process of exposing the material layer PDLm for the pixel-defining layer to the light and developing it, the material layer PT1m for the first anti-contact layer (see FIG. 11) may be formed together in the process of forming the pixel-defining layer PDL. When the material layer PT1m for the first anti-contact layer (see FIG. 11) is etched by a cleaning solution, no additional process may be required. Therefore, even though the anti-contact layer PT is further disposed, it is possible to suppress or prevent a decrease in the process efficiency, or it is possible to suppress or prevent an increase in the process cost.

In addition, as a partial region of the material layer PT1m for the first anti-contact layer is removed, the residues of the material layer PDLm for the pixel-defining layer (see FIG. 10) that may remain on the material layer PT1m for the first anti-contact layer may also be removed. It is possible to reduce residues of the material layer PDLm (see FIG. 10) remaining on the anode electrode ANO. Accordingly, when the material layer PDLm for the pixel-defining layer (see FIG. 10) includes an organic material, it is possible to suppress or prevent dark spots which may be resulted from the residues of the material layer PDLm for the pixel-defining layer (see FIG. 10).

Figure 13:
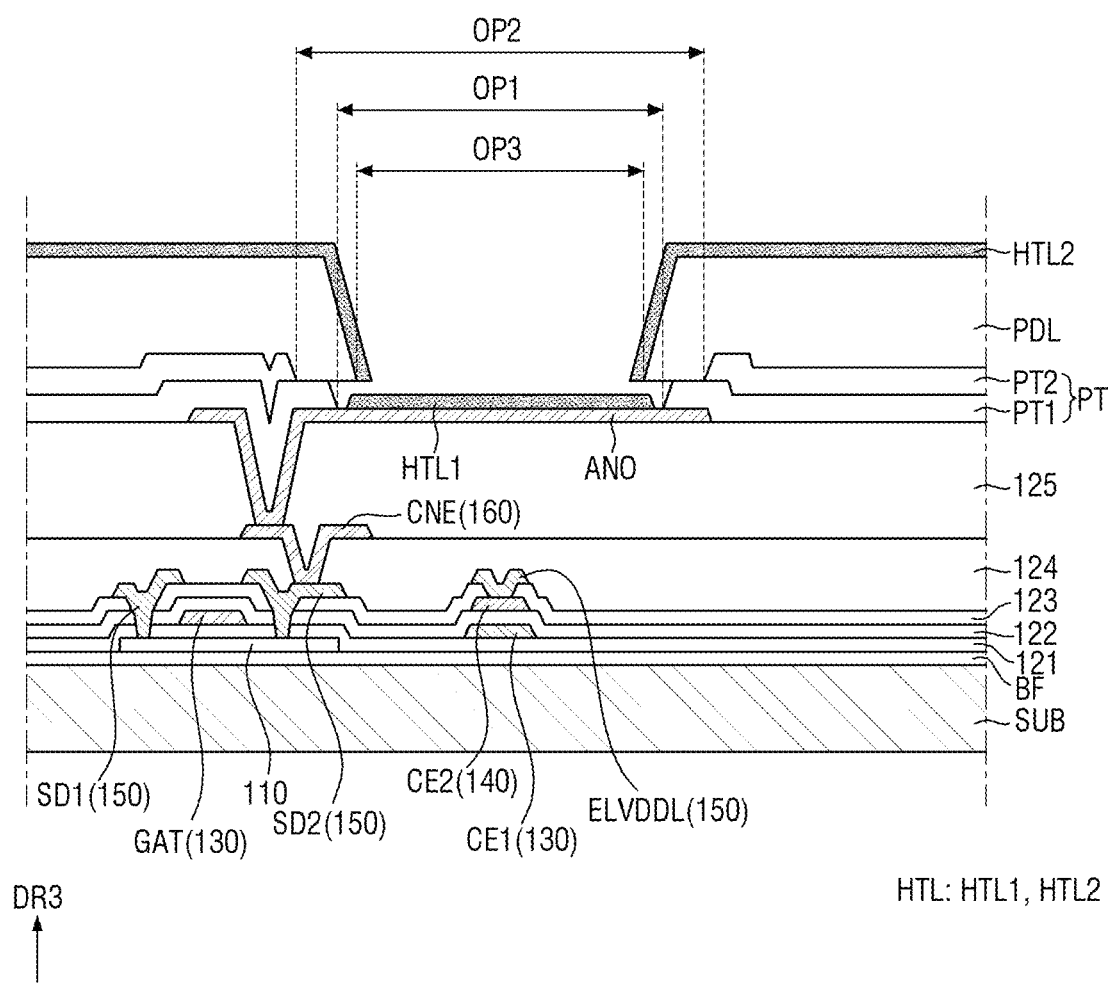

Subsequently, referring to FIG. 13, a hole injection/transport layer HTL is formed on the anode electrode ANO exposed by the pixel-defining layer PDL and the pixel-defining layer PDL. The hole injection/transport layer HTL may be disposed throughout the entire area of the substrate SUB. Accordingly, the first hole injection/transport layer HTL1 and the second hole injection/transport layer HTL2 separated from each other may be formed. The first hole injection/transport layer HTL1 and the second hole injection/transport layer HTL2 may be separated from each other by the separation area EMT (see FIG. 5).

Figure 14:
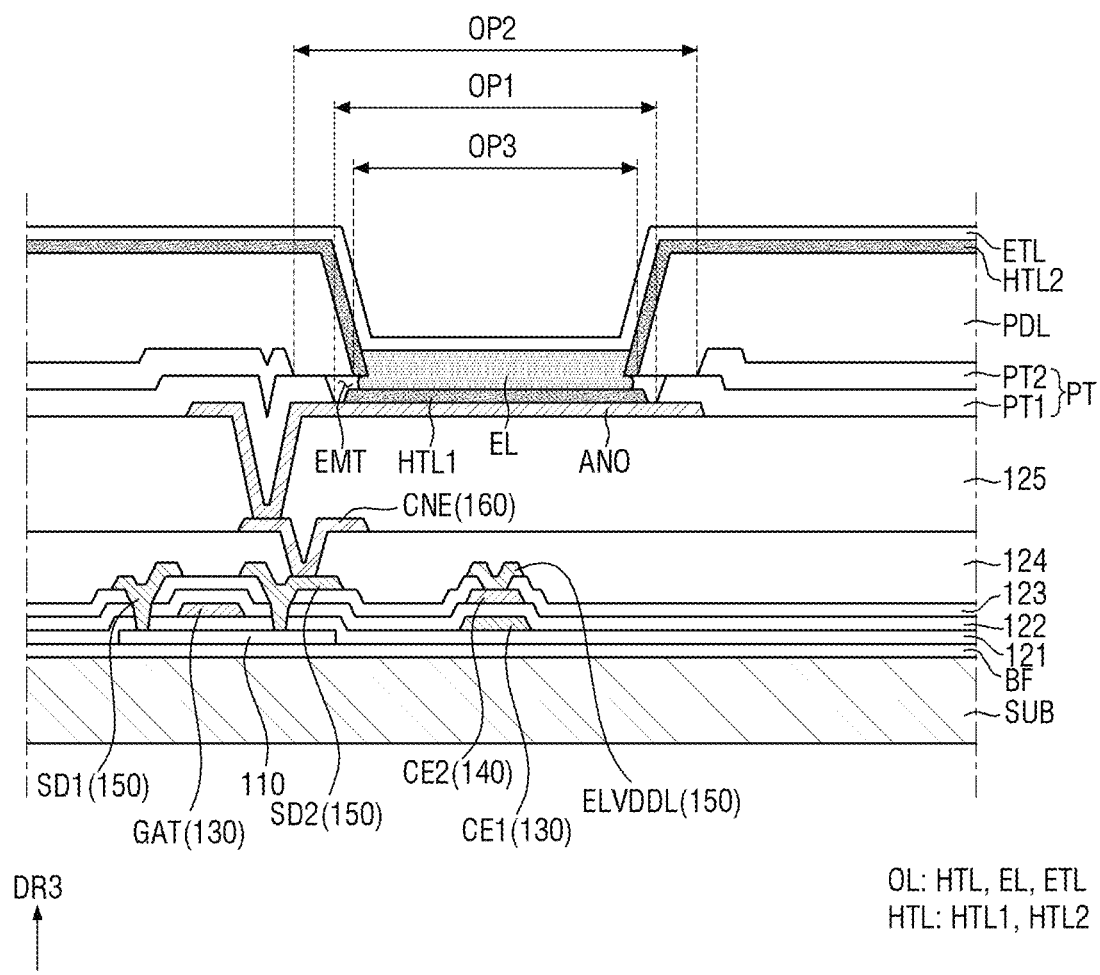

Subsequently, referring to FIG. 14, an emissive layer EL is formed on the first hole injection/transport layer HTL1, and an electron injection/transport layer ETL is formed on the emissive layer EL. When the emissive layer EL includes an organic material, the emissive layer EL may be disposed between the first hole injection/transport layer HTL1 and the second hole injection/transport layer HTL2. The electron injection/transport layer ETL may be formed throughout the entire area of the substrate SUB, and may be formed on the emissive layer EL and the second hole injection/transport layer HTL2.

Hereinafter, other embodiments will be described. In the following description, the same or similar elements will be denoted by the same or similar reference numerals, and redundant descriptions will be omitted or briefly described for sake of brevity. Descriptions will be made focusing on differences from the above embodiment.

Figure 15:
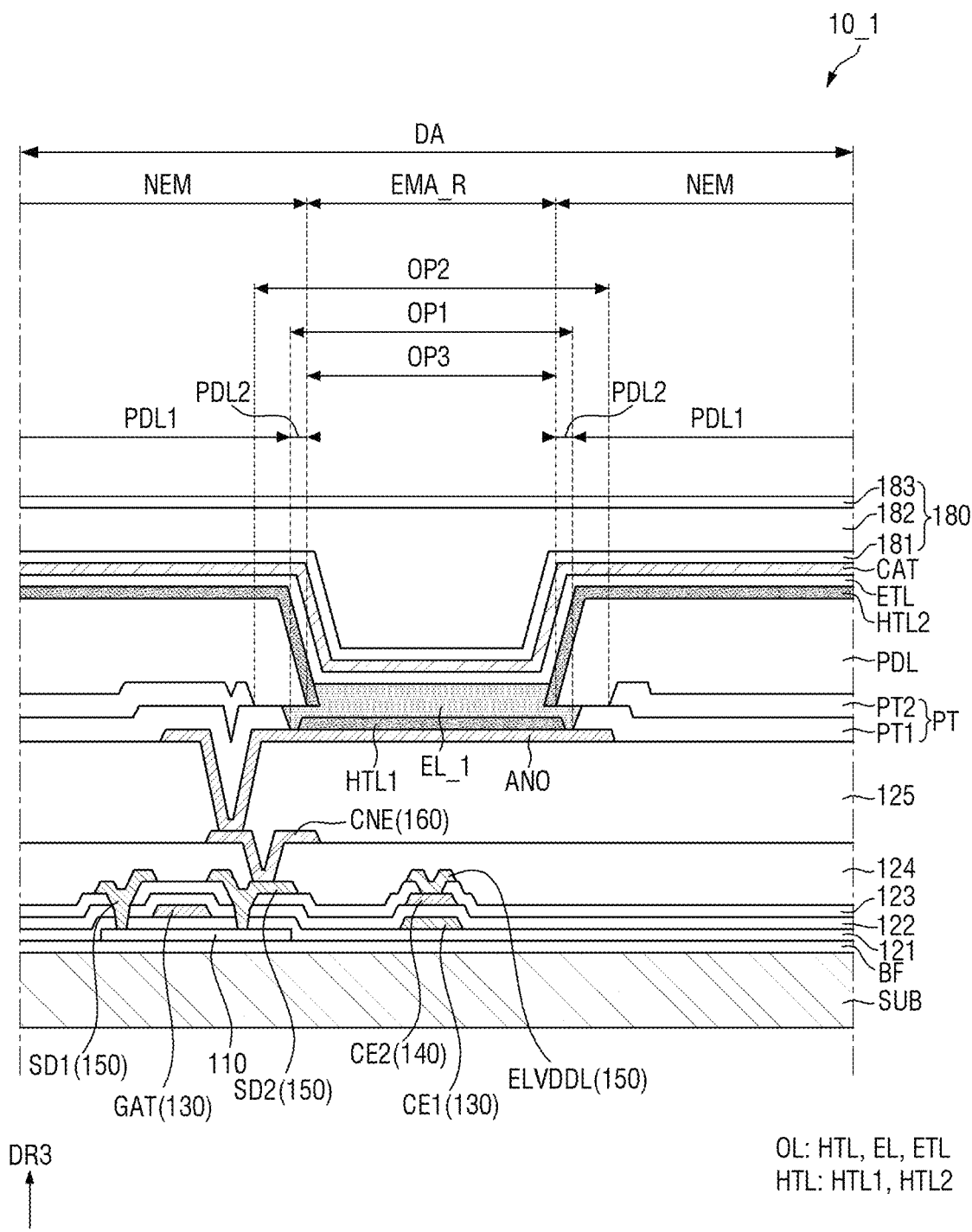
FIG. 15 is a cross-sectional view of a display device according to another embodiment.

FIG. 15 is a cross-sectional view of a display device according to another embodiment.

The embodiment of FIG. 15 is different from the embodiment of FIG. 5 in that the separation area EMT (see FIG. 5) between the pixel-defining layer PDL and the anode electrode ANO is completely filled with an emissive layer EL_1 of a display panel 10_1 of a display device. In this instance, the emissive layer EL_1 may be in direct contact with the anode electrode ANO not covered by the anti-contact layer PT.

Even in this case, by disposing the contact layer PT, it is possible to suppress or prevent defects such as dark spots and voids of the anode electrode ANO. In addition, the first hole injection/transport layer HTL1 and the second hole injection/transport layer HTL2 are separated from each other, so that it is possible to suppress or prevent lateral leakage current between adjacent pixels. In addition, as the separation area EMT (see FIG. 5) is filled with the emissive layer EL_1, it is possible to block outside air and moisture which may permeate into the separation area EMT (see FIG. 5), thereby suppressing or preventing defects caused by outside air and moisture. As a result, reliability of the display device can be further improved.

Figure 16:
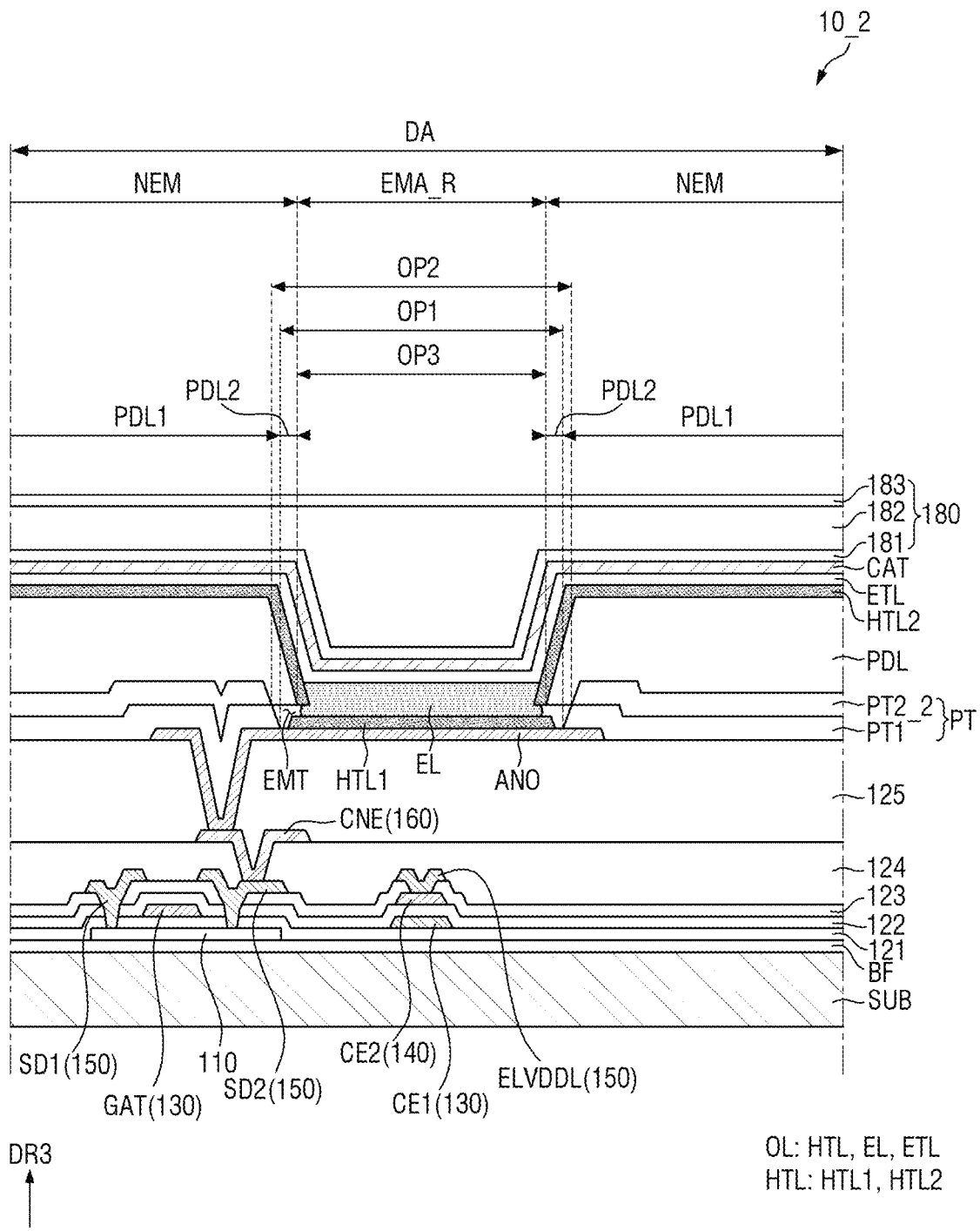
FIG. 16 is a cross-sectional view of a display device according to yet another embodiment.

FIG. 16 is a cross-sectional view of a display device according to yet another embodiment.

The embodiment of FIG. 16 is different from the embodiment of FIG. 5 in that a side surface of a first anti-contact layer PT1 and a side surface of a second anti-contact layer PT2_2 of a display panel 10_2 of a display device are aligned with each other.

Even in this case, by disposing the contact layer PT, it is possible to suppress or prevent defects such as dark spots and voids of the anode electrode ANO. In addition, the first hole injection/transport layer HTL1 and the second hole injection/transport layer HTL2 are separated from each other, so that it is possible to suppress or prevent lateral leakage current between adjacent pixels. In addition, in this instance, the degree of etching of the material layer PT1m for the first anti-contact layer (see FIG. 12) can be adjusted as necessary, so that various designs may be possible.

Figure 17:
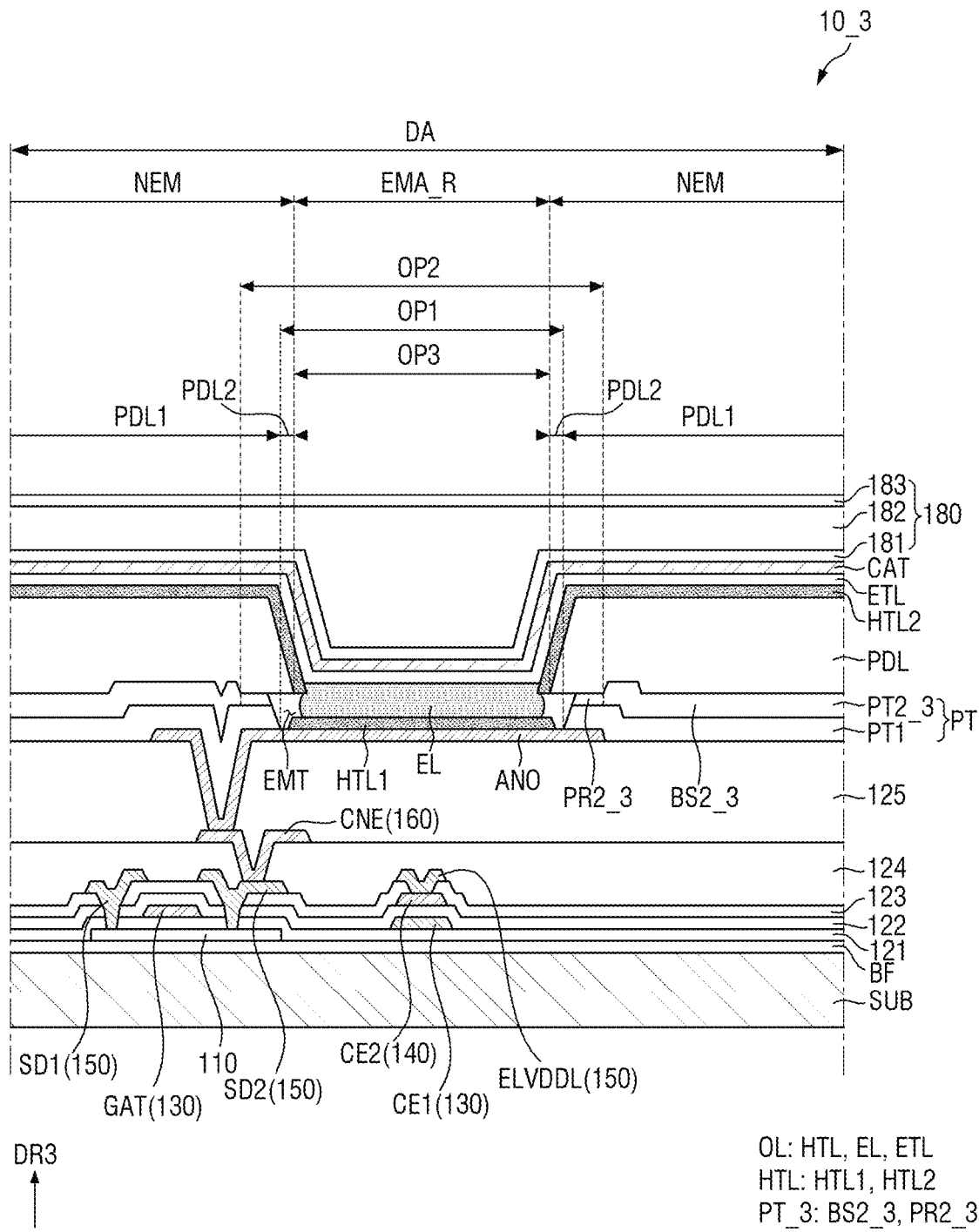
FIG. 17 is a cross-sectional view of a display device according to yet another embodiment.

FIG. 17 is a cross-sectional view of a display device according to yet another embodiment.

The embodiment of FIG. 17 is different from the embodiment of FIG. 5 in that a second anti-contact layer PT2_3 of a display panel 10_3 of a display device includes a base portion BS2_3 and a protruding portion PR2_3 having different thicknesses.

Specifically, the thickness of the base portion BS2_3 of the second anti-contact layer PT2_3 may be greater than the thickness of the protruding portion PR2_3 of the second anti-contact layer PT2_3. Herein, the thickness of each of the base portion BS2_3 and the protruding portion PR2_3 may refer to the average thickness throughout the entire area of each of the base portion BS2_3 and the protruding portion PR2_3. The protruding portion PR2_3 may protrude from the base portion BS2_3 toward the emissive layer EL.

The side surface of the protruding portion PR2_3 of the second anti-contact layer PT2_3 may be aligned with the side surface of the first anti-contact layer PT1 (the inner wall of the first opening OP1), but the embodiment described herein is not limited thereto.

The pixel-defining layer PDL may cover one surface (upper surface) of the protruding portion PR2_3 of the second anti-contact layer PT2_3, but may not cover the side surface of the protruding portion PR2_3 of the second anti-contact layer PT2_3. The opposite surface (lower surface) of the pixel-defining layer PDL may be located at a level substantially higher than the surface (upper surface) of the first anti-contact layer PT1 from one surface or the opposite surface of the substrate SUB.

Even in this case, by disposing the contact layer PT, it is possible to suppress or prevent defects such as dark spots and voids of the anode electrode ANO. In addition, the first hole injection/transport layer HTL1 and the second hole injection/transport layer HTL2 are separated from each other, so that it is possible to suppress or prevent lateral leakage current between adjacent pixels. In addition, in this instance, the degree of etching of the material layer PT2m for the second anti-contact layer (see FIG. 8) can be adjusted as necessary, so that various designs may be possible.

Figure 18:
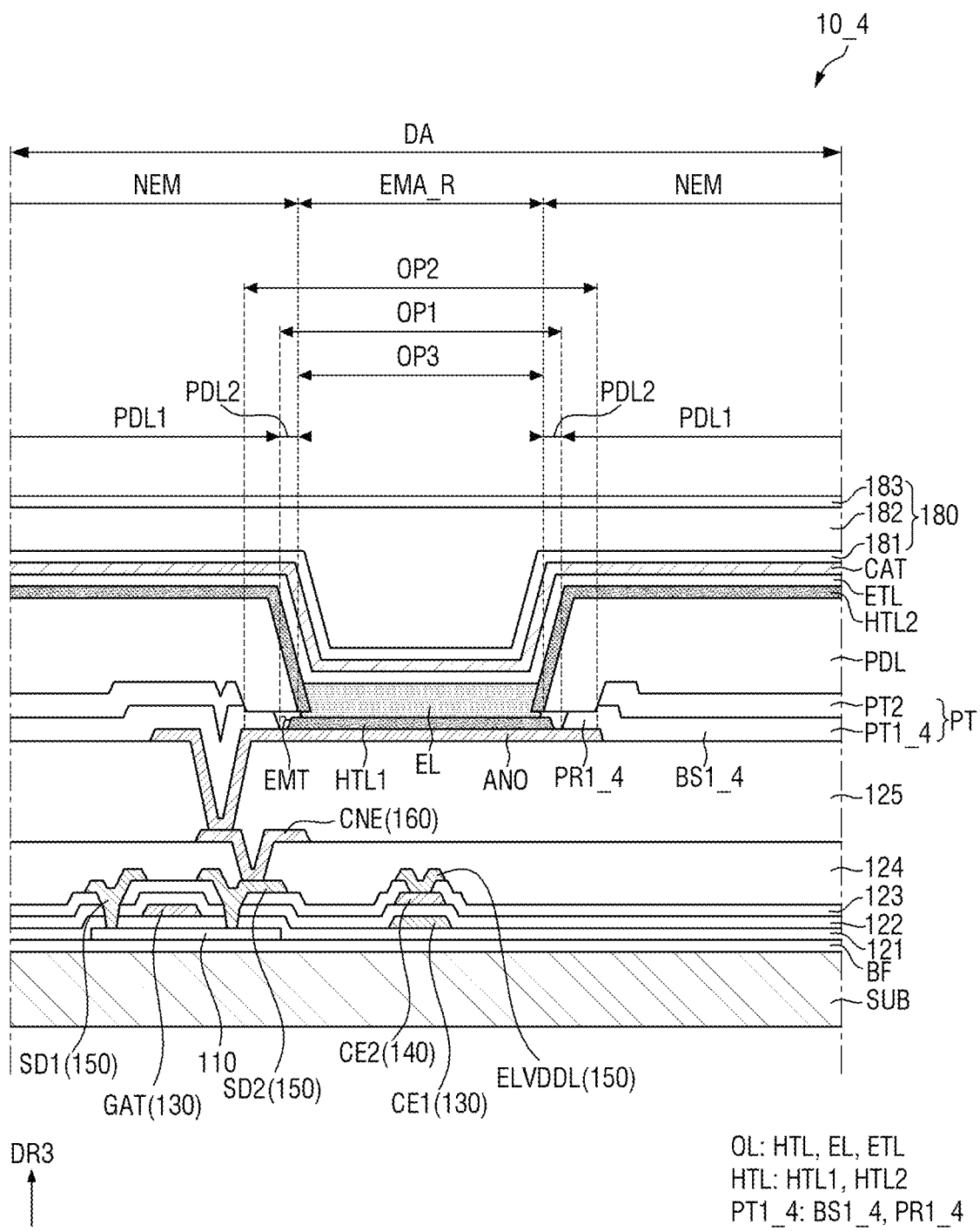
FIG. 18 is a cross-sectional view of a display device according to yet another embodiment.

FIG. 18 is a cross-sectional view of a display device according to yet another embodiment.

The embodiment of FIG. 18 is different from the embodiment of FIG. 5 in that a first anti-contact layer PT1_4 of a display panel 10_4 of a display device includes a base portion BS1_4 and a protruding portion PR1_4 having different thicknesses.

Specifically, the thickness of the base portion BS1_4 of the first anti-contact layer PT1_4 may be smaller than the thickness of the protruding portion PR1_4 of the first anti-contact layer PT1_4. Herein, the thickness of each of the base portion BS1_4 and the protruding portion PR1_4 may refer to the average thickness across its entire area. The protruding portion PR1_4 may protrude from the base portion BS1_4 toward the emissive layer EL or the first hole injection/transport layer HTL1.

The side surface of the base portion BS1_4 of the first anti-contact layer PT1_4 connecting the upper surface of the protruding portion PR1_4 of the first anti-contact layer PT1_4 with the upper surface of the base portion BS1_4 of the first anti-contact layer PT1_4 may be aligned with the side surface of the second anti-contact layer PT2 (the inner wall of the second opening OP2). It should be understood, however, that embodiments described herein are not limited thereto.

The pixel-defining layer PDL may cover one surface and the side surface of the second anti-contact layer PT2, and may cover one surface of the protruding portion PR1_4 of the first anti-contact layer PT1_4 and the side surface of the base portion BS1_4 of the first anti-contact layer PT1_4 connecting the upper surface of the protruding portion PR1_4 of the first anti-contact layer PT1_4 with the upper surface of the base portion BS1_4 of the first anti-contact layer PT1_4.

Even in this case, by disposing the contact layer PT, it is possible to suppress or prevent defects such as dark spots and voids of the anode electrode ANO. In addition, the first hole injection/transport layer HTL1 and the second hole injection/transport layer HTL2 are separated from each other, so that it is possible to suppress or prevent lateral leakage current between adjacent pixels. In addition, in this instance, the degree of etching of the material layer PT1*m* for the first anti-contact layer (see FIG. 11) and the material layer PT2*m* for the second anti-contact layer (see FIG. 8) can be adjusted as necessary, so that various designs may be possible.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art

What is claimed is:

1. A display device comprising:
a substrate;
an anode electrode disposed on the substrate;
a first anti-contact layer disposed on the anode electrode and comprising molybdenum trioxide (MoO3);
a second anti-contact layer disposed on the first anti-contact layer and comprising molybdenum dioxide (MoO2); and
a pixel-defining layer disposed on the second anti-contact layer,
wherein the first anti-contact layer includes a first opening,
wherein the second anti-contact layer defines a second opening,
wherein the pixel-defining layer defines a third opening, and
wherein the first opening, the second opening and the third opening overlap one another in a thickness direction of the substrate and expose the anode electrode,
wherein the first opening that is of the first anti-contact layer surrounds the third opening that is of the pixel-defining layer when viewed from the top, and
wherein the second opening that is of the second anti-contact layer surrounds the first opening that is of the first anti-contact layer.

2. The display device of claim 1,
further comprising:
a hole injection/transport layer comprising a first hole injection/transport layer disposed on the anode electrode exposed by the first opening, the second opening and the third opening, and a second hole injection/transport layer disposed on the pixel-defining layer,
wherein the first hole injection/transport layer and the second hole injection/transport layer are separated from each other.

3. The display device of claim 2,
wherein the first hole injection/transport layer has an island shape in a plan view.

4. The display device of claim 3,
further comprising:
a plurality of emission areas; and
a non-emission area surrounding each of the plurality of emission areas,
wherein the first hole injection/transport layer is disposed in each of the emission areas.

5. The display device of claim 2,
wherein the pixel-defining layer comprises:
an overlapping portion overlapping at least one of the first anti-contact layer and the second anti-contact layer; and
a non-overlapping portion that does not overlap the first anti-contact layer and that does not overlap the second anti-contact layer, but that does overlap the anode electrode.

6. The display device of claim 5,
further comprising:
an emissive layer disposed on the first hole injection/transport layer,
wherein the emissive layer is disposed between the non-overlapping portion of the pixel-defining layer and the anode electrode.

7. The display device of claim 6,
further comprising:
an electron injection/transport layer disposed on the emissive layer; and
a cathode electrode disposed on the electron injection/transport layer.

8. The display device of claim 1,
wherein a light transmittance of the first anti-contact layer is greater than a light transmittance of the second anti-contact layer.

9. The display device of claim 8,
wherein a thickness of the second anti-contact layer lies within a range of 1,000 Å to 9,000 Å.

10. The display device of claim 1,
wherein an electrical resistance of the first anti-contact layer is greater than an electrical resistance of the second anti-contact layer.

11. The display device of claim 1,
wherein an entire area of the second anti-contact layer overlaps the first anti-contact layer.

12. The display device of claim 1,
wherein an inner wall of the third opening protrudes outward from an inner wall of the first opening.

13. The display device of claim 12,
wherein the inner wall of the first opening protrudes outward from an inner wall of the second opening.

14. The display device of claim 1,
wherein the anode electrode comprises a first stacked conductive layer, a second stacked conductive layer and a third stacked conductive layer sequentially stacked on one another,
wherein the first stacked conductive layer and the third stacked conductive layer comprise indium-tin-oxide (ITO), and
wherein the second stacked conductive layer comprises silver (Ag).

15. A display device comprising:
a substrate;
an anode electrode disposed on the substrate;
a first anti-contact layer comprising molybdenum trioxide (MoO3) and disposed on the anode electrode to expose the anode electrode;
a second anti-contact layer; and
a pixel-defining layer disposed on the first anti-contact layer and exposing the anode electrode exposed by the first anti-contact layer,
wherein the first anti-contact layer includes a first opening,
wherein the second anti-contact layer includes a second opening,
wherein the pixel-defining layer includes a third opening that overlaps the first opening,
wherein an inner wall of the third opening is disposed more to an outside of the substrate than an inner wall of the first opening,
wherein the first opening that is of the first anti-contact layer surrounds the third opening that is of the pixel-defining layer when viewed from the top, and wherein the second opening that is of the second anti-contact layer surrounds the first opening that is of the first anti-contact layer.

16. The display device of claim 15,
further comprising:
the second anti-contact layer disposed between the first anti-contact layer and the pixel-defining layer and comprising molybdenum dioxide (MoO2).

17. The display device of claim 16,
wherein a light transmittance of the first anti-contact layer is greater than a light transmittance of the second anti-contact layer, and
wherein an electrical resistance of the first anti-contact layer is greater than an electrical resistance of the second anti-contact layer.

18. The display device of claim 15,
further comprising:
a hole injection/transport layer comprising a first hole injection/transport layer disposed on the anode electrode exposed by the first anti-contact layer and the pixel-defining layer, and a second hole injection/transport layer disposed on the pixel-defining layer,
wherein the first hole injection/transport layer and the second hole injection/transport layer are separated from each other.

19. The display device of claim 18,
wherein the pixel-defining layer comprises and an overlapping portion overlapping the first anti-contact layer, and a non-overlapping portion overlapping not with the first anti-contact layer but with the anode electrode.

20. The display device of claim 19,
further comprising:
an emissive layer disposed on the first hole injection/transport layer,
wherein the emissive layer is disposed between the non-overlapping portion of the pixel-defining layer and the anode electrode.

21. The display device of claim 18,
wherein the first hole injection/transport layer has an island shape in a plan view.

* * * * *